United States Patent
Miyata et al.

(10) Patent No.: US 10,727,261 B2
(45) Date of Patent: Jul. 28, 2020

(54) IMAGE PICKUP DEVICE AND ELECTRONIC APPARATUS

(71) Applicant: SONY CORPORATION, Tokyo (JP)

(72) Inventors: Satoe Miyata, Tokyo (JP); Itaru Oshiyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/069,304

(22) PCT Filed: Jan. 6, 2017

(86) PCT No.: PCT/JP2017/000205
§ 371 (c)(1),
(2) Date: Jul. 11, 2018

(87) PCT Pub. No.: WO2017/126329
PCT Pub. Date: Jul. 27, 2017

(65) Prior Publication Data
US 2019/0027518 A1    Jan. 24, 2019

(30) Foreign Application Priority Data
Jan. 21, 2016    (JP) .................................. 2016-009695

(51) Int. Cl.
*H01L 27/146*    (2006.01)
(52) U.S. Cl.
CPC ...... *H01L 27/1462* (2013.01); *H01L 27/1463* (2013.01); *H01L 27/14621* (2013.01);
(Continued)
(58) Field of Classification Search
CPC ........... H01L 27/14621; H01L 27/1462; H01L 27/14623; H01L 27/1463; H01L 27/14645
See application file for complete search history.

(56) References Cited

U.S. PATENT DOCUMENTS

2004/0227140 A1*  11/2004 Lee .................... H01L 27/14601
                                                                257/79
2005/0040440 A1    2/2005 Murakami
(Continued)

FOREIGN PATENT DOCUMENTS

EP    2413362    2/2012
EP    2863437    4/2015
(Continued)

OTHER PUBLICATIONS

Extended European Search Report for European Patent Application No. 17741209.5, dated Feb. 14, 2019, 10 pages.
(Continued)

*Primary Examiner* — Cuong Q Nguyen
(74) *Attorney, Agent, or Firm* — Sheridan Ross P.C.

(57) ABSTRACT

The present technology relates to an image pickup device and an electronic apparatus that are configured to enhance characteristics. A solid-state image pickup device includes a photoelectric conversion section that is arranged on a semiconductor substrate and configured to photoelectrically convert an incident light, a moth-eye section that includes recesses and projections formed on a surface on a light incident side in the semiconductor substrate and has, when a cross section approximately parallel to a direction toward the photoelectric conversion section from the light incident side is viewed, a recessed portion protruding toward the side of the photoelectric conversion section, the recessed portion having a curvature or a polygonal shape, and a region that is arranged adjacent to and opposite to the photoelectric conversion section of the moth-eye section and has a refractive index different from a refractive index of the semiconductor substrate.

13 Claims, 15 Drawing Sheets

(52) U.S. Cl.
CPC .. *H01L 27/14623* (2013.01); *H01L 27/14645* (2013.01); *H01L 27/14627* (2013.01); *H01L 27/14636* (2013.01)

(56) References Cited

U.S. PATENT DOCUMENTS

| | | |
|---|---|---|
| 2006/0113552 A1 | 6/2006 | Song et al. |
| 2009/0286346 A1 | 11/2009 | Adkisson |
| 2010/0244169 A1 | 9/2010 | Maeda |
| 2014/0021573 A1* | 1/2014 | Nishimaki ........ H01L 27/14607 257/431 |
| 2015/0015758 A1 | 1/2015 | Ikeda |
| 2015/0085369 A1 | 3/2015 | Tazawa |
| 2015/0155314 A1* | 6/2015 | Takagi ................ H01L 27/1462 257/443 |
| 2016/0112614 A1 | 4/2016 | Masuda |

FOREIGN PATENT DOCUMENTS

| | | |
|---|---|---|
| JP | 2005-072097 | 3/2005 |
| JP | 2010-239003 | 10/2010 |
| JP | 2010-272612 | 12/2010 |
| JP | 2013-033864 | 2/2013 |
| JP | 2014-003140 | 1/2014 |
| JP | 2015-018906 | 1/2015 |
| JP | 2015-029054 | 2/2015 |
| JP | 2015-068853 | 4/2015 |
| WO | WO 2007/074977 | 7/2007 |
| WO | WO 2015/001987 | 1/2015 |

OTHER PUBLICATIONS

International Search Report prepared by the Japan Patent Office dated Feb. 22, 2017, for International Application No. PCT/JP2017/000205.

* cited by examiner

FIG.6
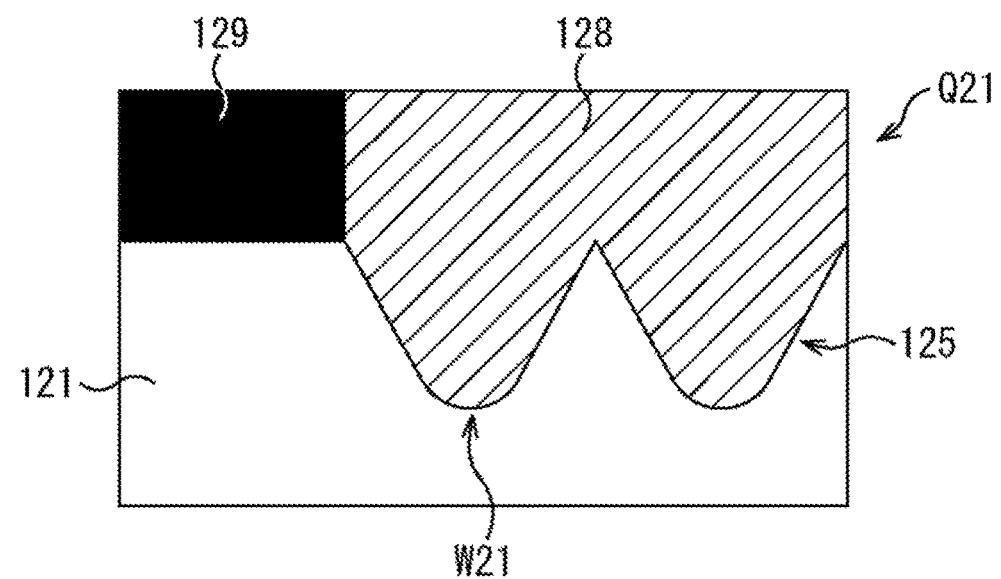
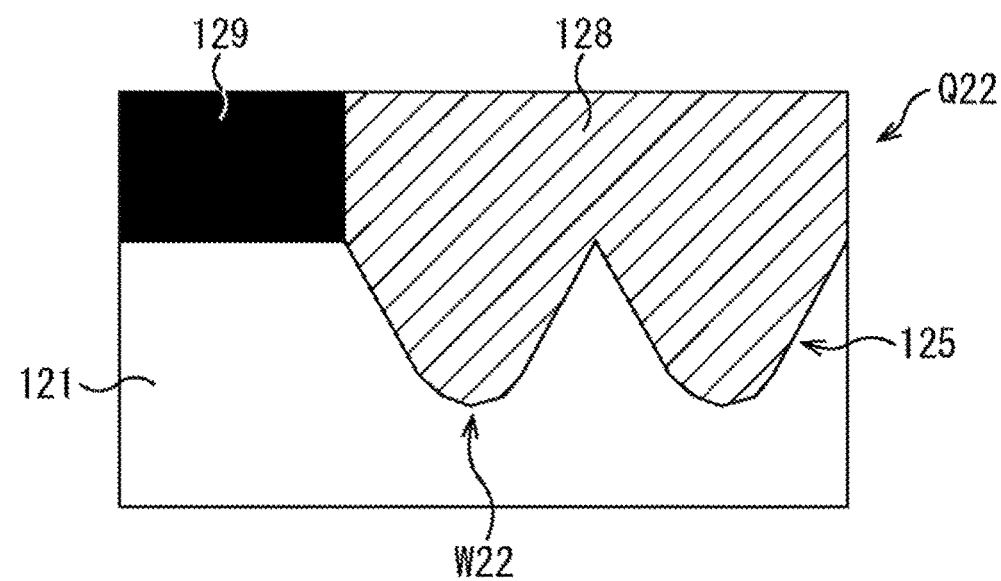

IMAGE PICKUP DEVICE AND ELECTRONIC APPARATUS

CROSS REFERENCE TO RELATED APPLICATIONS

This application is a national stage application under 35 U.S.C. 371 and claims the benefit of PCT Application No. PCT/JP2017/000205 having an international filing date of 6 Jan. 2017, which designated the United States, which PCT application claimed the benefit of Japanese Patent Application No. 2016-009695 filed 21 Jan. 2016, the entire disclosures of each of which are incorporated herein by reference.

TECHNICAL FIELD

The present technology relates to an image pickup device and an electronic apparatus and, more particularly, to an image pickup device and an electronic apparatus that are configured to enhance characteristics thereof.

BACKGROUND ART

It is desirable for a solid-state image pickup device to receive light from a subject into a photoreception section without reflection so as to be converted into an electrical signal by a photoelectric conversion function, thereby enhancing the conversion efficiency in the photoreception section.

For this purpose, it is desired to reduce, as far as possible, the reflection component of light that is caused on each of the interfaces of a laminated structure constituting a solid-state image pickup device. Further, reducing the reflection of light on each interface results in the reduction of such phenomena caused in the solid-state image pickup device as flare, ghost, blooming, and the like.

Therefore, technologies have been proposed in which, in a solid-state image pickup device arranged with a photoelectric conversion section configured to convert received light into electrical charges and a semiconductor substrate including the photoelectric conversion section, a multitude of regions having refractive indexes different from that of the semiconductor substrate are arranged between the surface of the side into which light enters and the photoelectric conversion section in the semiconductor substrate, thereby reducing the reflection of incident light (refer to PTL 1, for example).

The multitude of the regions having different refractive indexes formed on the semiconductor substrate are formed such that the area of the regions gets larger as the regions get nearer in depth to the surface of the side into which light enters in the semiconductor substrate and smaller as the regions get more remote in depth from this surface.

A moth-eye structure in which the semiconductor substrate is formed in a projecting (projected) conical manner from the light incident direction to the semiconductor substrate as described above can mitigate the drastic variation in the refractive index in the interface, one of the causes of light reflection, thereby reducing the influence of reflected light. That is, providing a moth-eye structure allows the refractive index to slowly vary along the incident direction of light, thereby reducing the reflection of light.

CITATION LIST

Patent Literature

[PTL 1]
JP 2015-18906A

SUMMARY

Technical Problems

However, the technology is sometimes unable to provide solid-state image pickup device having sufficient characteristics.

To be more specific, in a case where a region of moth-eye structure is formed on a semiconductor substrate, the influence of the recessed and projected portions in that region may cause the uneven mold or peeling in an insulation film or a color filter formed on the semiconductor substrate. If this happens, noise may be caused on the interface between the insulation film or the color filter and the semiconductor substrate, thereby deteriorating the characteristics such as the sensitivity of the solid-state image pickup device. In addition, the yield of the solid-state image pickup device may be lowered.

The present technology has been developed by taking the above-mentioned situations into consideration so as to enhance the characteristics.

Solution to Problems

In carrying out the present technology and according to one aspect thereof, there is provided an image pickup device. This image pickup device includes a photoelectric conversion section that is arranged on a semiconductor substrate and configured to photoelectrically convert an incident light; a moth-eye section that includes recesses and projections formed on a surface on a light incident side in the semiconductor substrate and has, when a cross section approximately parallel to a direction toward the photoelectric conversion section from the light incident side is viewed, a recessed portion protruding toward the side of the photoelectric conversion section, the recessed portion having a curvature or a polygonal shape; and a region that is arranged adjacent to and opposite to the photoelectric conversion section of the moth-eye section and has a refractive index different from a refractive index of the semiconductor substrate.

A projected portion protruding opposite to the photoelectric conversion section in the moth-eye section may have a curvature or a polygonal shape.

The curvature of the recessed portion may be larger than the curvature of the projected portion.

The curvature of the recessed portion may be approximately equal to the curvature of the projected portion.

The refractive index of the semiconductor substrate may be larger than the refractive index of the region.

The moth-eye section is formed with a plurality of conical-shaped regions protruding toward the side of the photoelectric conversion section.

The moth-eye section may be formed with a plurality of conical-shaped regions protruding opposite to the photoelectric conversion section.

The conical-shaped regions may be arranged in lattice.

The plurality of conical-shaped regions including sizes or shapes that may be different from each other are irregularly arranged.

The moth-eye section may be formed with the plurality of the recessed portions that are linear in shape long along the direction approximately perpendicular to the cross section and arranged side by side.

Between the photoelectric conversion sections mutually adjacent to each other in the semiconductor substrate, an inter-pixel separation section configured to electrically separate the photoelectric conversion sections from each other may be arranged.

An inter-pixel light blocking film for blocking the light may be formed inside the inter-pixel separation section.

In the image pickup device according to the first aspect of the present technology, there are provided a photoelectric conversion section that is arranged on a semiconductor substrate and configured to photoelectrically convert an incident light; a moth-eye section that includes recesses and projections formed on a surface on a light incident side in the semiconductor substrate and has, when a cross section approximately parallel to a direction toward the photoelectric conversion section from the light incident side is viewed, a recessed portion protruding toward the side of the photoelectric conversion section, the recessed portion having a curvature or a polygonal shape; and a region that is arranged adjacent to and opposite to the photoelectric conversion section of the moth-eye section and has a refractive index different from a refractive index of the semiconductor substrate.

In carrying out the present technology and according to a second aspect thereof, there is provided an electronic apparatus. This electronic apparatus includes a photoelectric conversion section that is arranged on a semiconductor substrate and configured to photoelectrically convert an incident light; a moth-eye section that includes recesses and projections formed on a surface on a light incident side in the semiconductor substrate and has, when a cross section approximately parallel to a direction toward the photoelectric conversion section from the light incident side is viewed, a recessed portion protruding toward the side of the photoelectric conversion section, the recessed portion having a curvature or a polygonal shape; and a region that is arranged adjacent to and opposite to the photoelectric conversion section of the moth-eye section and has a refractive index different from a refractive index of the semiconductor substrate.

In the electronic apparatus according to the second aspect of the present technology, there are provided a photoelectric conversion section that is arranged on a semiconductor substrate and configured to photoelectrically convert an incident light; a moth-eye section that includes recesses and projections formed on a surface on a light incident side in the semiconductor substrate and has, when a cross section approximately parallel to a direction toward the photoelectric conversion section from the light incident side is viewed, a recessed portion protruding toward the side of the photoelectric conversion section, the recessed portion having a curvature or a polygonal shape; and a region that is arranged adjacent to and opposite to the photoelectric conversion section of the moth-eye section and has a refractive index different from a refractive index of the semiconductor substrate.

Advantageous Effect of Invention

According to the first aspect and the second aspect of the present technology, the characteristics can be enhanced.

BRIEF DESCRIPTION OF DRAWINGS

FIG. 6 is a diagram illustrating another example of a configuration of a moth-eye section.

DESCRIPTION OF EMBODIMENTS

The following describes embodiments to which the present technology is applied with reference to drawings.

First Embodiment

<Moth-Eye Structure>

Firstly, a solid-state image pickup device having a general moth-eye structure is described.

Figure 1:
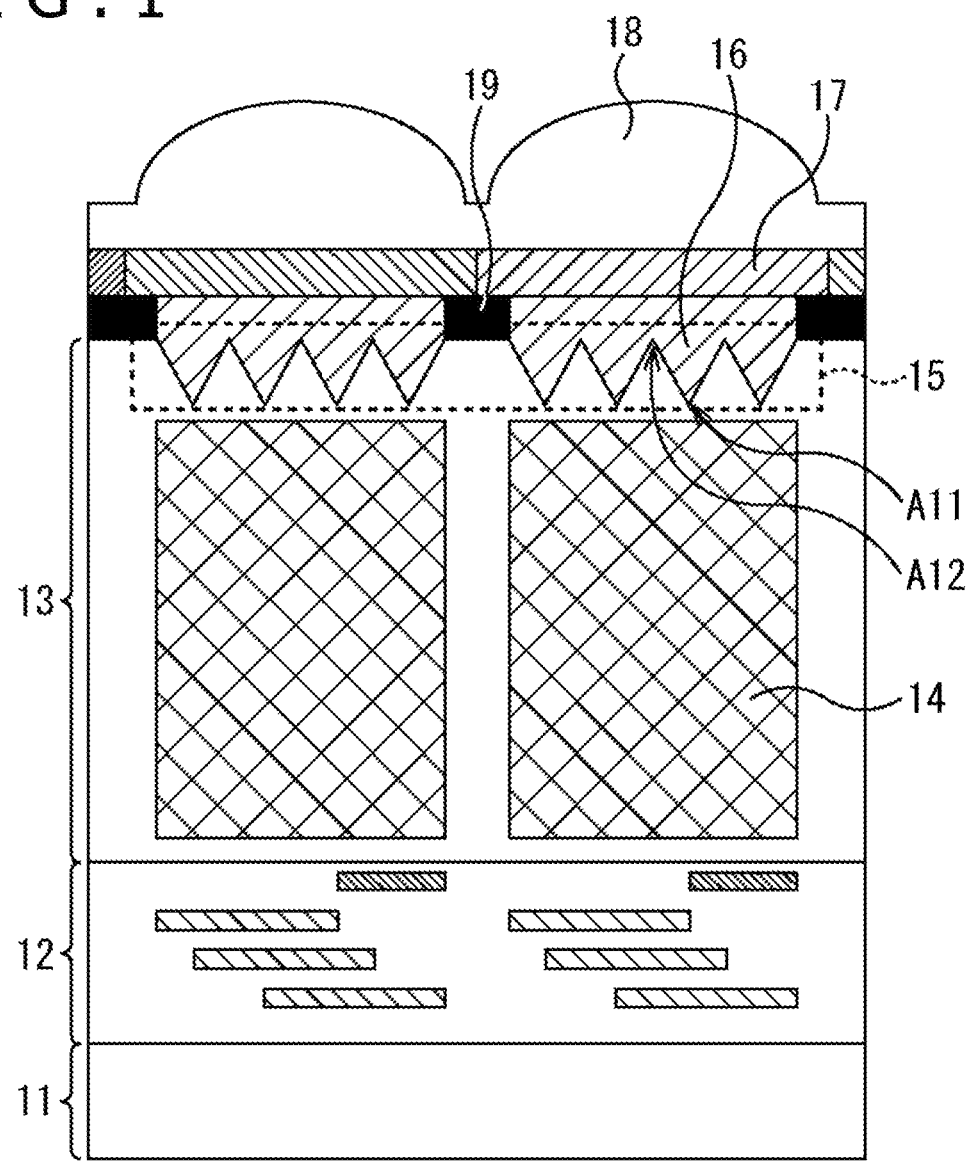
FIG. 1 is a diagram for describing a general moth-eye structure.

With a solid-state image pickup device having a general moth-eye structure, a multilayer wiring layer 12 and a semiconductor substrate 13 are laminated on a support substrate 11 as illustrated in FIG. 1.

For example, pixel transistors and wirings are arranged on the multilayer wiring layer 12. In addition, a photo diode 14 is arranged for each pixel in the semiconductor substrate 13 and, at the same time, a moth-eye section 15 that is a moth-eye structure region is also arranged on a surface portion of the upper side of the semiconductor substrate 13 in the drawing.

In the drawing, a color filter 17 and an on-chip lens 18 are arranged for each pixel on the upper side of the moth-eye section 15 through an insulation film 16. It should be noted that, to be precise, a planarization film is also formed on the portion of the insulation film 16.

Further, on the layer on which the insulation film 16 is formed, an inter-pixel light blocking section 19 is also arranged between pixels. The inter-pixel light blocking section 19 prevents the light that entered the on-chip lens 18 of a predetermined pixel from entering the photo diode 14 of another pixel.

The solid-state image pickup device having the moth-eye section 15 described above can reduce the reflection of the light entering from the moth-eye section 15 into the photo diode 14.

However, with the moth-eye section 15 that is conical in shape as described above, the recessed portion of the photo diode 14 side, namely, the portion indicated with an arrow A11, and the projected portion of the insulation film 16 side, namely, the portion indicated with an arrow A12, are not planar but are sharp in shape. Therefore, forming the insulation film 16 on the surface of the moth-eye section 15 and then forming the color filter 17 on that surface easily cause uneven mold or peeling of the insulation film 16 or the color filter 17. That is, this deteriorates the adhesion.

Consequently, noise is caused on the interface and so on between the semiconductor substrate 13 and the insulation film 16, thereby deteriorating the characteristics (performance) such as the sensitivity or lowering the yield.

Therefore, with the present technology, in a moth-eye structure in which the semiconductor substrate is formed in a projecting or recessing cones or polygonal pyramids manner from the light incident side to the semiconductor substrate, the recessed portion of the semiconductor substrate is provided with a curvature, thereby preventing the uneven mold and peeling of the insulation film, the color filter, and so on that are formed on the semiconductor substrate so as to enhance the adhesion.

The structure described above allows the prevention of the occurrence of noise in the proximity of the interface between an insulation film, a color filter, and so on, and a semiconductor substrate, thereby realizing the enhancement of the sensitivity of solid-state image pickup device and the prevention of ghosts and so on due to reflected light and, at the same time, enhance the yield.

<Exemplary Configuration of Image Pickup Apparatus>

The following describes specific embodiments to which the present technology is applied.

The present technology is applicable to various kinds of electronic apparatuses having a solid-state image pickup device, such as digital cameras, video cameras, mobile telephones, copy machines, and so on as well as the solid-state image pickup device; in what follows, however, the description will be done by use of an example in which the present technology is applied to an image pickup apparatus having a solid-state image pickup device.

Figure 2:
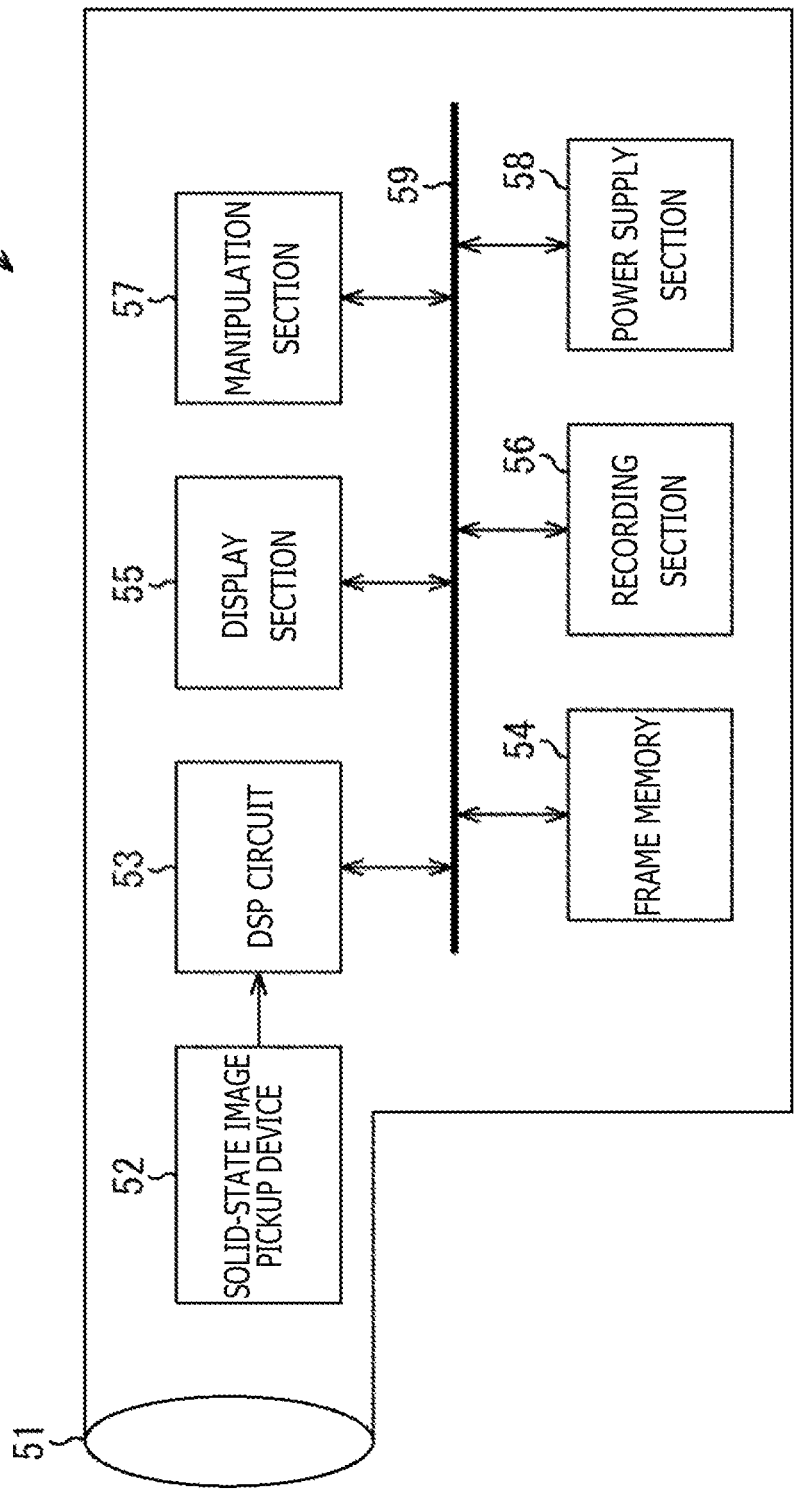
FIG. 2 is a diagram illustrating an example of a configuration of an image pickup apparatus to which the present technology is applied.

FIG. 2 is a diagram illustrating an example of a configuration of an image pickup apparatus to which the present technology is applied.

An image pickup apparatus 41 illustrated in FIG. 2 has an optical system 51 including a lens group and so on, a solid-state image pickup device 52, a DSP (Digital Signal Processor) circuit 53, a frame memory 54, a display section 55, a recording section 56, a manipulation section 57, and a power supply section 58. Further, the DSP circuit 53 through the power supply section 58 are interconnected via a bus line 59.

The optical system 51 captures an incident light (an image light) coming from a subject so as to form an image on the image pickup surface of the solid-state image pickup device 52. The solid-state image pickup device 52 converts the light quantity of the incident light formed on the image pickup surface by the optical system 51 into an electrical signal that is outputted as a pixel signal.

The DSP circuit 53 processes the signal coming from the solid-state image pickup device 52. For example, the DSP circuit 53 processes the signal coming from each pixel obtained by an image pickup operation by the solid-state image pickup device 52, thereby processing of expanding the processed signal into the frame memory 54.

The display section 55, including a liquid crystal display panel or an organic EL (Electro Luminescence) panel, displays a moving image or a still image taken by the solid-state image pickup device 52. The recording section 56 records the moving image or the still image taken by the solid-state image pickup device 52 to a recording medium such as a DVD (Digital Versatile Disk) or the like.

The manipulation section 57, operated by a user, issues manipulation commands with respect to various functions provided by the image pickup apparatus 41. The power supply section 58 supplies powers for operation, from time to time, to the targets of power supply, namely, the DSP circuit 53, the frame memory 54, the display section 55, the recording section 56, and the manipulation section 57.

<Exemplary Configuration of Solid-State Image Pickup Device>

Figure 3:
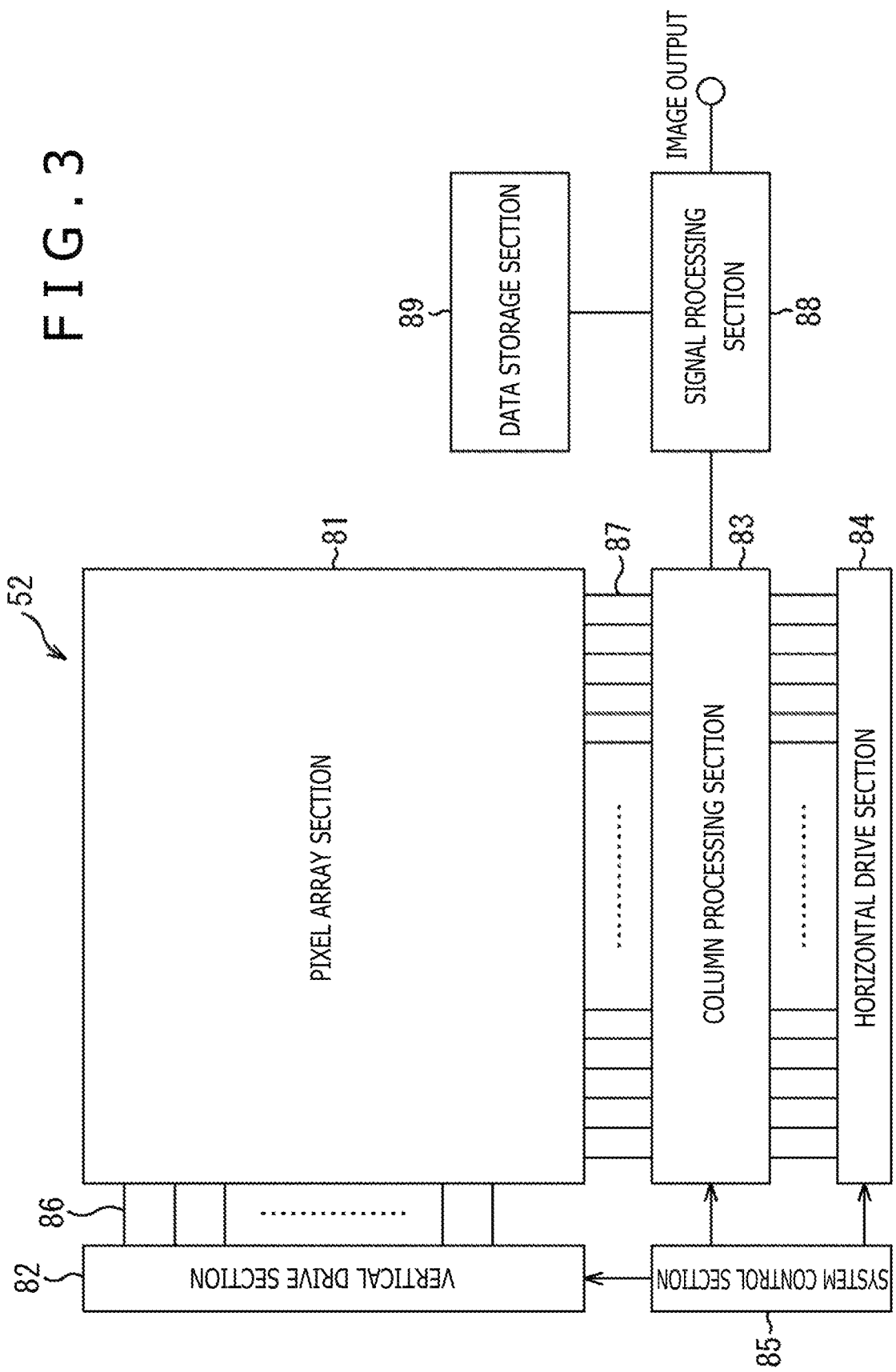
FIG. 3 is a diagram illustrating an example of a configuration of a solid-state image pickup device.

Further, the solid-state image pickup device 52 illustrated in the FIG. 2 is configured as illustrated in FIG. 3, for example.

The solid-state image pickup device 52 is a solid-state image pickup apparatus such as a CMOS (Complementary Metal Oxide Semiconductor) image sensor or the like.

The solid-state image pickup device 52 has a pixel array section 81 obtained by forming an on-chip lens or the like on a semiconductor substrate (chip) not illustrated and a peripheral circuit section on which integrated on the same semiconductor substrate on which the pixel array section 81 is formed. The peripheral circuit section has a vertical drive section 82, a column processing section 83, a horizontal drive section 84, and a system control section 85.

Additionally, the solid-state image pickup device 52 has a signal processing section 88 and a data storage section 89. It should be noted that the signal processing section 88 and the data storage section 89 may be installed on the same substrate on which the solid-state image pickup device 52 is installed or on a substrate separate from the substrate on which the solid-state image pickup device 52 is installed.

The pixel array section 81 has a configuration in which unit pixels (hereafter sometimes referred to simply as pixels) each having a photoelectric conversion section for generating electrical charges in accordance with the quantity of received light and storing the generated electrical charges are two-dimensionally arranged in a row direction and a column direction, namely, in matrix.

Here, the row direction is an arrangement direction of pixels on rows (namely, the horizontal direction) and the column direction is an arrangement direction of pixels on columns (namely, the vertical direction). The row direction is the lateral direction in the drawing and the column direction is the up and down direction in the drawing.

In the pixel array section 81, relative to a pixel arrangement of matrix, a pixel drive line 86 is wired along the row direction for each pixel row and a vertical signal line 87 is wired along the column direction for each pixel column. The pixel drive line 86 transmits a drive signal for driving the reading of a signal from a pixel. It should be noted that, in FIG. 3, one pixel drive line 86 is illustrated as one wiring; however, the number of pixel drive lines 86 is not limited to one. One end of the pixel drive line 86 is connected to an output terminal corresponding to each row of the vertical drive section 82.

The vertical drive section 82, including a shift register, an address decoder, and so on, drives each pixel of the pixel array section 81 all at once, in units of rows, or the like. That is, together with the system control section 85 for controlling the vertical drive section 82, the vertical drive section 82 constitutes a drive section that drives the operation of each pixel of the pixel array section 81. Although the drawing of a specific configuration is omitted, this vertical drive section 82 generally has two scan systems, a read scan system and a sweep scan system.

A signal outputted from each unit pixel of a pixel row selectively scanned by the vertical drive section 82 is inputted in the column processing section 83 through the vertical signal line 87 for each pixel column. The column processing section 83 executes predetermined signal processing on a signal outputted through the vertical signal line 87 from each pixel of a selected row for each pixel row of the pixel array section 81 and, at the same time, temporarily holds the signal-processed pixel signals.

To be more specific, the column processing section 83 executes noise elimination processing, DDS (Double Data Sampling), CDS (Correlated Double Sampling), and other sampling processing, AD (Analog Digital) conversion processing, and so on as the signal processing.

The horizontal drive section 84, including a shift register, an address decoder, and so on, sequentially selects a unit circuit corresponding to a pixel column of the column processing section 83. This selective scan by the horizontal drive section 84 sequentially outputs the pixel signals signal-processed for each unit circuit in the column processing section 83.

The system control section 85, including a timing generator for generating various types of timing signals and so on, executes drive control on the vertical drive section 82, the column processing section 83, and the horizontal drive section 84 on the basis of various types of timings generated by that timing generator.

The signal processing section 88 at least has a computation processing function and executes various types of signal processing operations such as computation processing on the pixel signals outputted from the column processing section 83. The data storage section 89 temporarily stores the data necessary for the signal processing to be executed in the signal processing section 88.

<Exemplary Configuration of Pixel Array Section>

Figure 4:
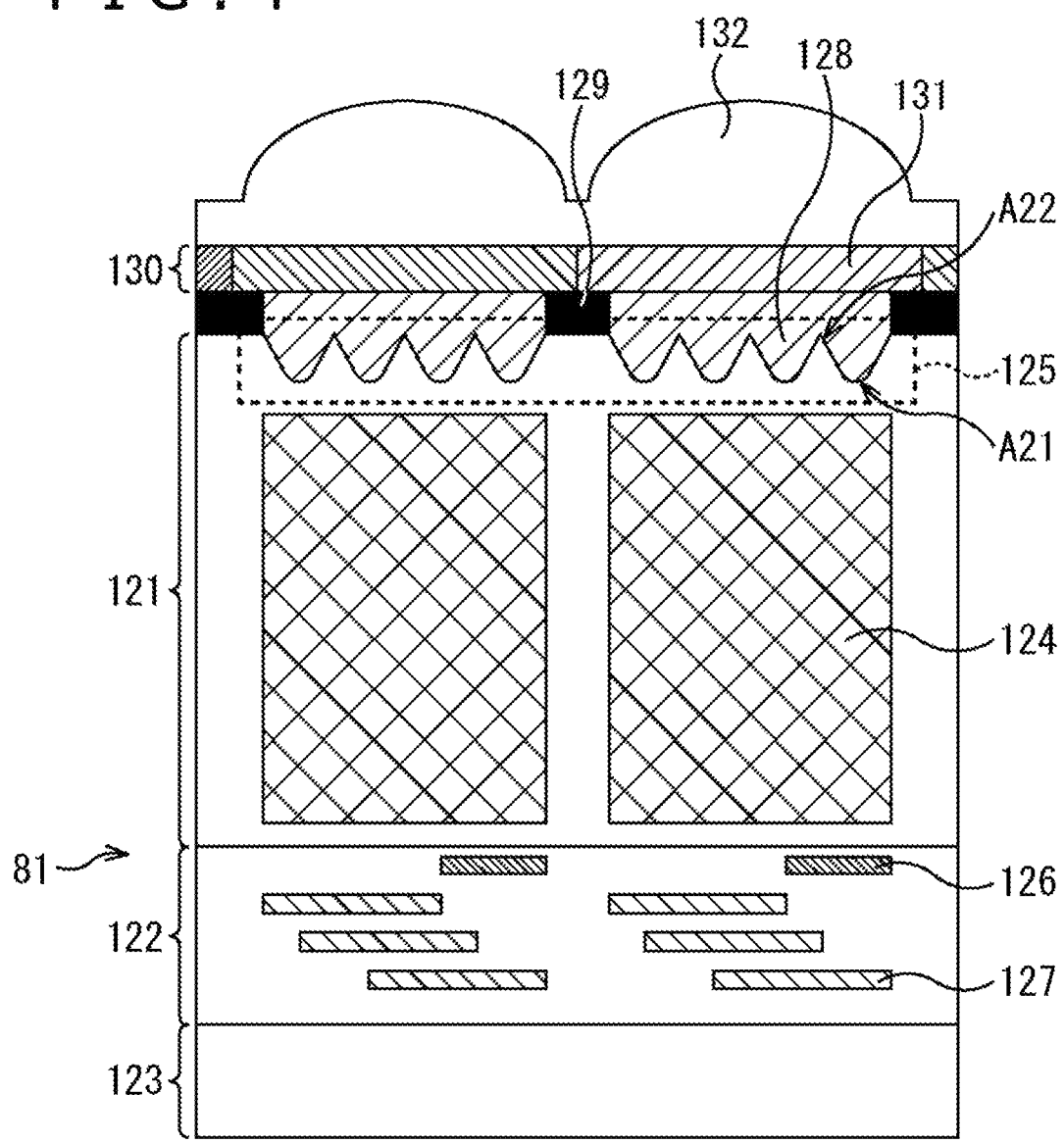
FIG. 4 is a diagram illustrating an example of a configuration of a pixel array section.

In addition, pixels each including a photodiode and so on are arranged on the pixel array section 81, the cross section of this pixel array section 81 being configured as illustrated in FIG. 4, for example.

In the example illustrated in FIG. 4, the pixel array section 81 has a semiconductor substrate 121, a multilayer wiring layer 122 formed on a surface of the semiconductor substrate 121, and a support substrate 123.

The semiconductor substrate 121 is constituted of silicon, for example, and the thickness of the semiconductor substrate 121 is 1 to 6 µm, for example.

Further, in the semiconductor substrate 121, a photodiode 124 is formed on a pixel basis by forming a semiconductor region of N-type (the second conductivity) for each pixel in a semiconductor region of P-type (the first conductivity), for example. This photodiode 124 is a photoelectric conversion section for receiving the incident light from the outside to photoelectrically convers the received light, thereby storing the resultant electrical charges. It should be noted that, in FIG. 4, only one of the multiple photodiodes 124 is assigned with a reference sign.

In the drawing of the N-type semiconductor region providing an electrical charge storage region of the photodiode 124, the interface of the P-type semiconductor region (the interface on the side of photoreception) of the upper side constitutes a moth-eye section 125 that functions as a reflection prevention section for preventing the reflection of incident light through a so-called moth-eye structure in which a microscopic recessed and projected structure is formed.

That is, microscopic recesses and projections are formed on the surface of the side in which the light from the outside enters in the semiconductor substrate 121, this recessed and projected portion providing the moth-eye section 125.

The microscopic recessed and projected portion of the moth-eye section 125 are formed conical, such as polygonal pyramids or cones. Also, in this microscopic recessed and projected structure, a region in which the semiconductor substrate 121 is recessed has a curvature (no angle) when viewing the cross section in the direction toward the photodiode 124 in the semiconductor substrate 121, namely, approximately parallel to the downward direction from the light incident side.

In this example, a portion indicated by arrow A21 of the moth-eye section 125, for example, has a curvature that is a recessed region protruding downward in the drawing, namely, to the side of the photodiode 124; in what follows, this recessed region is especially referred to as the recessed portion of the moth-eye section 125.

Further, the microscopic recessed and projected structure of the moth-eye section 125 has a region in which the semiconductor substrate 121 is projected when viewing the cross section approximately parallel to the direction toward the photodiode 124 inside the semiconductor substrate 121 from the light incident side. In this example, the portion indicated by arrow A22 of the moth-eye section 125, for example, is a region that is projected upward in the drawing, namely, producing to the side opposite to the photodiode 124; in what follows, especially this projected region is referred to also as the projected portion of the moth-eye section 125.

The moth-eye section 125 may have a shape in which not only the recessed portion but also the projected portion has a curvature; however, it has been confirmed by the applicants hereof that especially a large curvature of the recessed portion is effective in enhancing the characteristics (the performance) of the solid-state image pickup device 52.

Consequently, with the moth-eye section 125, the curvature of a recessed portion may be handled to be approximately equal to the curvature of a projected portion; however, in this example, each recessed portion and each projected portion are formed such that the curvature of the recessed portion is larger than the curvature of the projected portion.

To be more specific, in a case where visible light is detected with the photodiode 124, let the curvature radius of a recessed portion be RA and the curvature radius of a projected portion be RB, then it has been confirmed that it is especially effective in the enhancement of the characteristics if RA/RB 1.3 is satisfied. Hence, with the moth-eye section 125, the projected portions and the recessed portions are formed to as to satisfy this relation.

It should be noted that the moth-eye section 125 having the recessed portions and the projected portions such as above is formed by use of the anisotropy of wet etching. Further, also in embodiments and variations to be described later, the projected portion and the recessed portion of the moth-eye section 125 may satisfy RA/RB≥1.3 or have approximately the same curvature between the recessed portion and the projected portion.

For example, with the moth-eye section 125, a conical pitch (length) equivalent to a cycle in which the microscopic recesses and projections including recessed portions and projected portions are horizontally arranged in the drawing is the length that is determined by the wavelength and so on of a light received at the photodiode 124. As one example, in a case where a visible light is detected with the photodiode 124, for example, the conical pitch of the moth-eye section 125 is set to a range of 40 to 380 nm.

The conical pitch and the recessed and projected depth, and the curvature radius of recessed portion and projected portion of the moth-eye section 125 may be properly determined in accordance with the wavelengths of such lights to be detected by the photodiode 124 as visible light, infrared light, and lights of other wavelength bands.

The multilayer wiring layer 122 has two or more wiring layers and inter-layer insulation films. Further, the multilayer wiring layer 122 is formed with two or more pixel transistors 126 for reading electrical charges stored in the photodiode 124 and a wiring 127 connected to various types of the pixel transistors 126 and so on. For example, the wiring 127 is a wiring such as the vertical signal line 87 illustrated in FIG. 3.

Further, the light incident side of the semiconductor substrate 121, namely, the surface opposite to the photodiode 124 side in the moth-eye section 125 of the semiconductor substrate 121 is formed with an insulation film 128 and an inter-pixel light blocking film 129. In addition, a color filter layer 130 is formed on the upper side in the drawing of the region in which the insulation film 128 and the inter-pixel light blocking film 129 are formed.

It should be noted that, to be more precise, a planarization film, not illustrated, is formed between the insulation film 128 and the inter-pixel light blocking film 129 and the color filter layer 130. Further, instead of the insulation film 128, a transparent insulation film may be formed and this transparent insulation film may be formed by combining and laminating two or more materials.

Here, the refractive index of the insulation film 128 arranged adjacent to the moth-eye section 125 is made different from the refractive index of the semiconductor substrate 121 constituting the moth-eye section 125, especially the P-type semiconductor region.

To be more specific, let the refractive index of the insulation film 128 arranged adjacent to the moth-eye section 125 be n1 and the refractive index of the semiconductor substrate 121 constituting the moth-eye section 125 be n2, then refractive index n1 and refractive index n2 satisfy a relation refractive index n1<refractive index n2, for example.

Thus, making refractive index n2 of the semiconductor substrate 121 be larger than refractive index n1 of the insulation film 128 allows the light reflection blocking effect provided by the moth-eye section 125 to be further enhanced.

The inter-pixel light blocking film 129 is formed at a position between pixels on the side of the moth-eye section 125 of the semiconductor substrate 121 so as to function as an inter-pixel light blocking section for separating the pixels.

The color filter layer 130 is arranged with a color filter 131 that transmits only a predetermined color component for each pixel, namely, for each photodiode 124. For example, in the color filter layer 130, the filters of the three colors R (Red), G (Green), and B (Blue) are arranged, in Bayer array, as the color filters 131 for the pixels.

These color filters 131 are formed by rotationally coating the photosensitive resin containing a color element such as pigment or dye.

It should be noted that the arrangement of the color filters 131 may not only Bayer array but also any one of other arrangements or the filters of other colors, W (White), Y (Yellow), and so on, may be arranged as the color filters 131.

Further, the upper side of each color filter 131 in the drawing, namely, the light incident side thereof, is formed with an on-chip lens 132 for each pixel. In the on-chip lens 132, the light entered from the outside is condensed to be efficiently put into the photodiode 124 through the color filter 131.

In the pixel array section 81 configured as described above, the light from a subject enters the on-chip lens 132 from the upside in the drawing. Next, the light from the subject is condensed by the on-chip lens 132 to be put in the photodiode 124 through the color filter 131, the insulation film 128, the moth-eye section 125, and the P-type semiconductor region of the semiconductor substrate 121.

At this moment, of the light condensed by the on-chip lens 132 of a predetermined pixel, the light traveling toward a pixel adjacent to the predetermined pixel is blocked by the inter-pixel light blocking film 129, so that this light is prevented from entering the photodiode 124 of another pixel.

The photodiode 124 photoelectrically converts the light entered from a subject so as to store the electrical charges obtained as a result of the conversion. Then, a voltage signal corresponding to the electrical charges stored in the photodiode 124 is read to the column processing section 83 through the pixel transistor 126 and the vertical signal line 87 that is the wiring 127.

In the image pickup apparatus 41 described above, providing a curvature to the recessed portion of the moth-eye section 125 so as to provide a comparatively gentle shape to the surface of the moth-eye section 125, thereby allowing the prevention of the occurrence of the uneven mold or peeling of the insulation film 128 or the color filter 131 that are formed on the semiconductor substrate 121. That is, this setup allows the enhancement of the adhesion between the semiconductor substrate 121 and the insulation film 128 or the color filter 131.

Consequently, the noise near the interface (boundary surface) of the insulation film 128 and the color filter 131 can be prevented from occurring, thereby enhancing the performance (characteristics) of the solid-state image pickup device 52, such as the enhancement in the sensitivity of the solid-state image pickup device 52 and the prevention of the occurrence of ghost and the like due to reflected light. In addition, the yield of the solid-state image pickup device 52 can also be enhanced.

The following describes one example of the materials constituting each section of the pixel array section 81 illustrated in FIG. 4.

The insulation film 128 arranged in the upper side in FIG. 4, namely, the light incident side of the moth-eye section 125, is formed, for example, by silicon oxide ($SiO_2$), silicon nitride (SiN), silicon oxynitride (SiON), hafnium oxide ($HfO_2$), aluminum oxide ($Al_2O_3$), zirconium oxide ($ZrO_2$), tantalum oxide ($Ta_2O_5$), titanium oxide ($TiO_2$), lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), thulium oxide ($Tm_2O_3$), ytterbium oxide ($Yb_2O_3$), lutetium oxide ($Lu_2O_3$), yttrium oxide ($Y_2O_3$), or resin. In addition, some of these materials may be combined and laminated to form the insulation film 128.

In addition, in a case where a transparent insulation film is used instead of the insulation film 128, making the refractive index of the transparent insulation film larger than the refractive index of the semiconductor substrate 121 as with the case of the insulation film 128 can further enhance the light reflection blocking effect caused by the moth-eye section 125.

Further, the transparent insulation film can be formed, for example, by silicon oxide ($SiO_2$), silicon nitride (SiN), silicon oxynitride (SiON), hafnium oxide ($HfO_2$), aluminum oxide ($Al_2O_3$), zirconium oxide ($ZrO_2$), tantalum oxide ($Ta_2O_5$), titanium oxide ($TiO_2$), lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), thulium oxide ($Tm_2O_3$), ytterbium oxide ($Yb_2O_3$), lutetium oxide ($Lu_2O_3$), yttrium oxide ($Y_2O_3$), or resin. In addition, some of these materials may be combined and laminated to form the transparent insulation film.

In addition, a planarization film that is formed together with the insulation film 128 may be formed with an organic material like resin or an insulation film such as silicon oxide ($SiO_2$), for example.

In addition, the inter-pixel light blocking film 129 is formed with a resin-based material such as tungsten (W), aluminum (Al), or copper (Cu) and the on-chip lens 132 formed with styrene resin, acrylic resin, styrene/acrylic copolymer resin, or siloxane resin.

The semiconductor substrate 121, constituted of silicon, amorphous silicon, SiC, or the like, is not limited to single crystal silicon and, therefore, may be constituted of any of semiconductor materials that are applicable as the material of the semiconductor substrate 121 constituting the solid-state image pickup device 52.

Further, the moth-eye section 125 illustrated in FIG. 4 has a configuration in which plural quadrangular pyramid regions that have apexes on the lower side in FIG. 4 formed by microscopic recesses and projections, namely, on the side of the semiconductor substrate 121, and are approximately equal in shape and size with each other, are regularly (lattice-like) arranged, for example, when viewed in the row direction or the column direction of the pixel array section 81.

Figure 5:
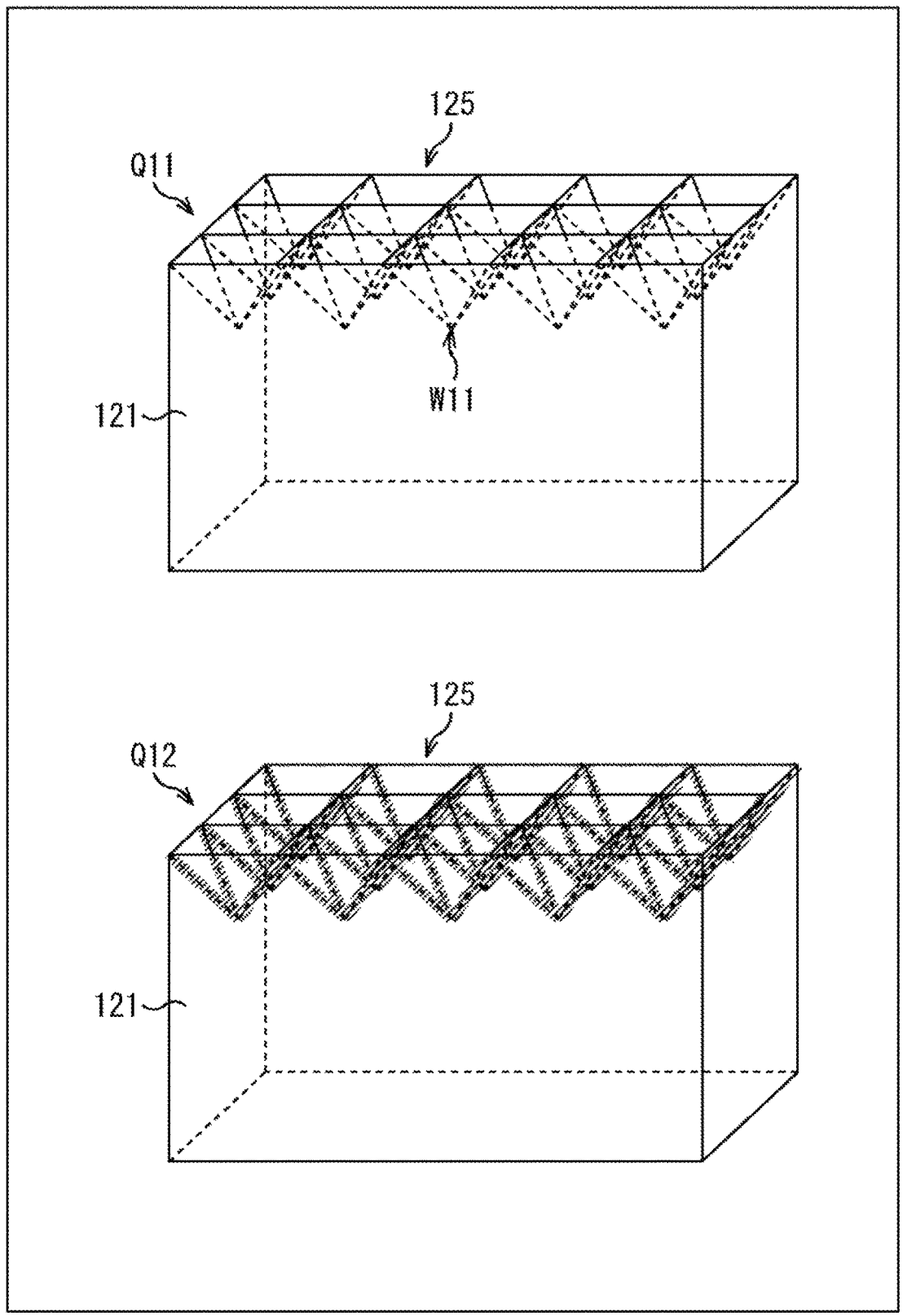
FIG. 5 is a diagram illustrating an example of a configuration of a moth-eye section.

In such a case, the moth-eye section 125 of the semiconductor substrate 121 is as illustrated in FIG. 5, for example. It should be noted that FIG. 5 is a perspective view of the moth-eye section 125 and, in FIG. 5, the same reference signs are assigned to the portions corresponding to those illustrated in FIG. 4, the description thereof being skipped.

In the example illustrated in FIG. 5, the upper side, in the drawing, of the semiconductor substrate 121 is the light incident side, namely, the side of the on-chip lens 132.

For example, as indicated with arrow Q11, the moth-eye section 125 is formed on the surface of the light incident side in the semiconductor substrate 121. Then, this moth-eye section 125 has an inverted pyramid structure in which plural regions of quadrangular pyramid shape having the apexes on the lower side in the drawing, namely, on the side of the photodiode 124 are regularly arranged. Here, the bottom surface of each quadrangular pyramid is square in shape and the semiconductor substrate 121 is engraved and formed such that each region of quadrangular pyramid shape protrudes to the side of the photodiode 124.

Especially, in the moth-eye section 125, the apex portion on the side of the photodiode 124 of each quadrangular pyramid region, the portion indicated with arrow W11, for example, is a recessed portion as described above, this recessed portion having a curvature and therefore presenting a round shape.

Further, some curvature may be given to the hypotenuse portion of each quadrangular pyramid region of the moth-eye section 125, namely, the hatched portion in the moth-eye section 125 indicated with arrow Q12. Giving a curvature also to the hatched portion described above allows the further enhancement in the effect of preventing the uneven mold or peeling of the insulation film 128 or the color filter 131.

Second Embodiment

<Another Exemplary Configuration of Moth-Eye Section>

Meanwhile, in the embodiment described above, the moth-eye section 125 is structured such that the recessed portion has a curvature as indicated by arrow Q21 in FIG. 6, for example. However, the recessed portion may have a polygonal shape as indicated by arrow Q22, for example. It should be noted that, with reference to FIG. 6, the same reference signs are assigned to the portions corresponding to those illustrated in FIG. 4, the description thereof being skipped.

FIG. 6 is a diagram illustrating a cross section of the on-chip lens 132 approximately parallel to the optical axis in the moth-eye section 125, namely, a cross section approximately parallel to the direction toward the photodiode 124 from the light incident side of the semiconductor substrate 121.

The moth-eye section 125 indicated by arrow Q21 is a partial expansion of the moth-eye section 125 illustrated in FIG. 4 and the portion indicated by arrow W21 in the moth-eye section 125 is recessed, for example. In this example, since the recessed portion has a curvature, the recessed portion has a gentle curved surface.

By contrast, in the example indicated by arrow Q22, the recessed portion of the moth-eye section 125, the portion indicated by arrow W22, for example, has a polygonal shape when viewing the cross section approximately parallel to the direction toward the photodiode 124 from the light incident side of the semiconductor substrate 121. In this example, since the recessed portion is polygonal, a part of a polygon to be more precise, the recessed portion is approximately curved while the recessed portion is formed with multitude of angles.

As described above, providing a structure in which the cross section of the recessed portion has multiple angles makes the shape of the recessed portion indicated by arrow W22 smoother overall than the recessed portion of the moth-eye section 15 illustrated in FIG. 1, for example, thereby preventing the uneven mold or peeling of the insulation film 128 and the color filter 131 that are formed on the semiconductor substrate 121. Especially, in this example, fine angles are provided on the recessed portion, so that the film peeling prevention effect of the insulation film 128 can be further enhanced.

It should be noted that, in the example indicated by arrow Q22, the moth-eye section 125 also has a structure in which multiple recessed portions that are polygonal and have approximately equal sizes as indicted by arrow W22 are arranged in lattice, namely, in matrix and regularly. Also, not only the recessed portions but also projected portions may be formed with cross section of each projected portion shaped in a polygonal manner.

Third Embodiment

<Another Exemplary Configuration of Pixel Array Section>

Figure 7:
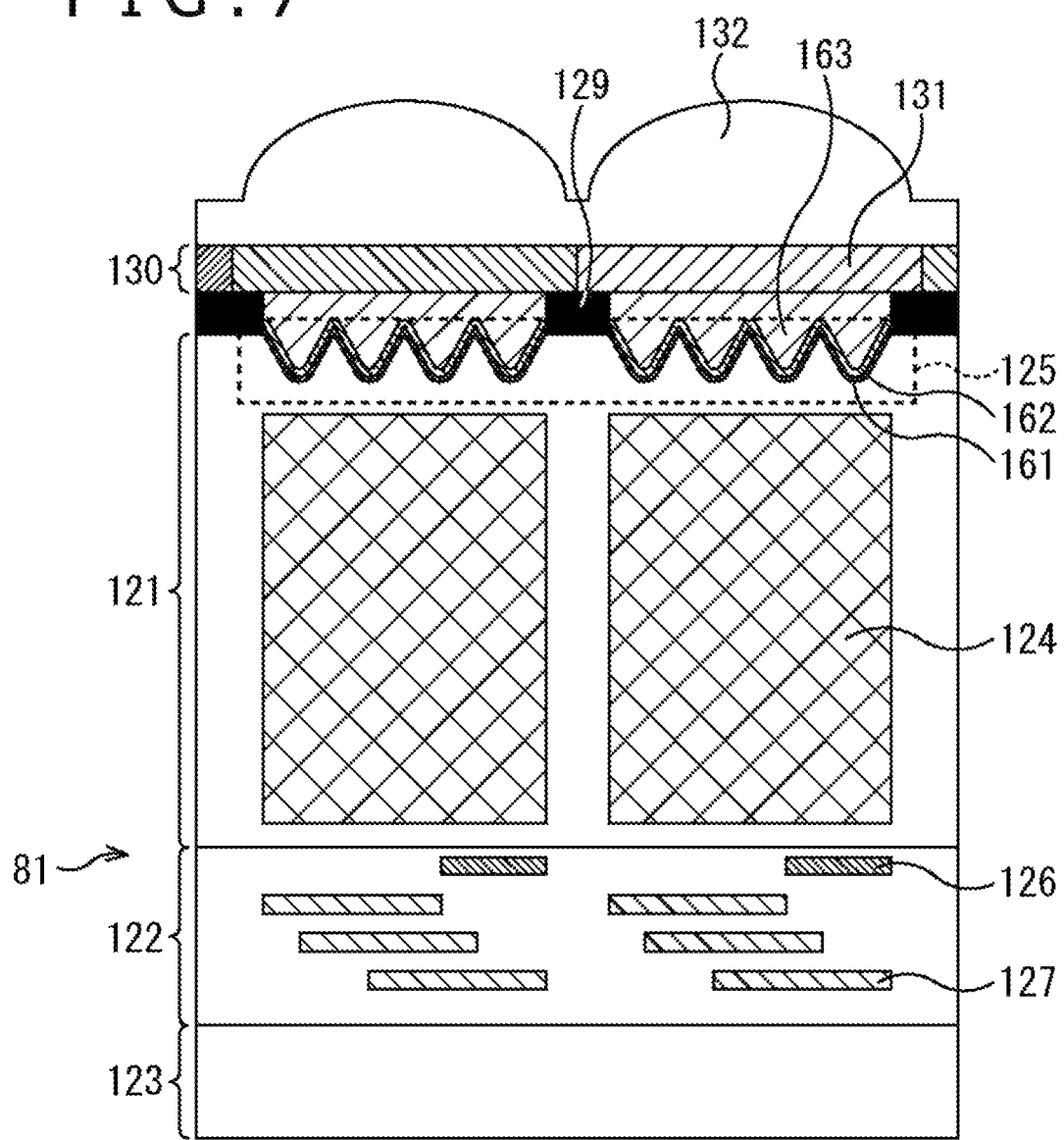
FIG. 7 is a diagram illustrating another example of a configuration of a pixel array section.

It is also practicable to form a reflection blocking film between the moth-eye section 125 and the insulation film or the transparent insulation film. In such a case, the pixel array section 81 has a structure as illustrated in FIG. 7, for example. It should be noted that with reference to FIG. 7, the same reference signs are assigned to the portions corresponding to those illustrated in FIG. 4, the description thereof being appropriately skipped.

In the example illustrated in FIG. 7, the surface portion of the on-chip lens 132 in the moth-eye section 125 is formed with a reflection blocking film 161 and the surface of this reflection blocking film 161 is further formed with a transparent insulation film 162 and a planarization film 163. Further, the color filter layer 130 is formed on the upper side in the drawing of the planarization film 163 and the inter-pixel light blocking film 129.

Thus, forming the reflection blocking film 161 on the surface of the moth-eye section 125 can further enhance light reflection blocking effects.

It should be noted that, also in this example, the microscopic recessed and projected portions of the moth-eye section 125 have inverted pyramid structure like the example illustrated in FIG. 4. That is, the moth-eye section 125 has a structure in which plural quadrangular pyramid regions of the approximately same shape and the approximately same size having apexes on the side of the photodiode 124 are arranged in lattice and regularly, the apex portion of the side of the photodiode 124 in each quadrangular pyramid region providing a recessed portion having a curvature.

Further, the reflection blocking film 161 is formed, for example, by silicon nitride (SiN), hafnium oxide (HfO$_2$), aluminum oxide (Al$_2$O$_3$), zirconium oxide (ZrO$_2$), tantalum oxide (Ta$_2$Ta$_5$), titanium oxide (TiO$_2$), lanthanum oxide (La$_2$O$_3$), praseodymium oxide (Pr$_2$O$_3$), cerium oxide (CeO$_2$), neodymium oxide (Nd$_2$O$_3$), promethium oxide (Pm$_2$O$_3$), samarium oxide (Sm$_2$O$_3$), europium oxide (Eu$_2$O$_3$), gadolinium oxide (Gd$_2$O$_3$), terbium oxide (Tb$_2$O$_3$), dysprosium oxide (Dy$_2$O$_3$), holmium oxide (Ho$_2$O$_3$), thulium oxide (Tm$_2$O$_3$), ytterbium oxide (Yb$_2$O$_3$), lutetium oxide (Lu$_2$O$_3$), yttrium oxide (Y$_2$O$_3$), or the like. It should be noted that the reflection blocking film 161 may be formed by combining and laminating some of these materials. Further, if the refractive index of the reflection blocking film 161 is also made less than the refractive index of the semiconductor substrate 121, the light reflection blocking effects can be further enhanced.

Further, the relation in refractive index between the material of the transparent insulation film 162 and the semiconductor substrate 121 is similar to that described with reference to the first embodiment. Still further, an insulation film may be arranged between the surface of the moth-eye section 125 and the reflection blocking film 161 in the configuration illustrated in FIG. 7.

Fourth Embodiment

<Another Exemplary Configuration of Moth-Eye Section>

Figure 8:
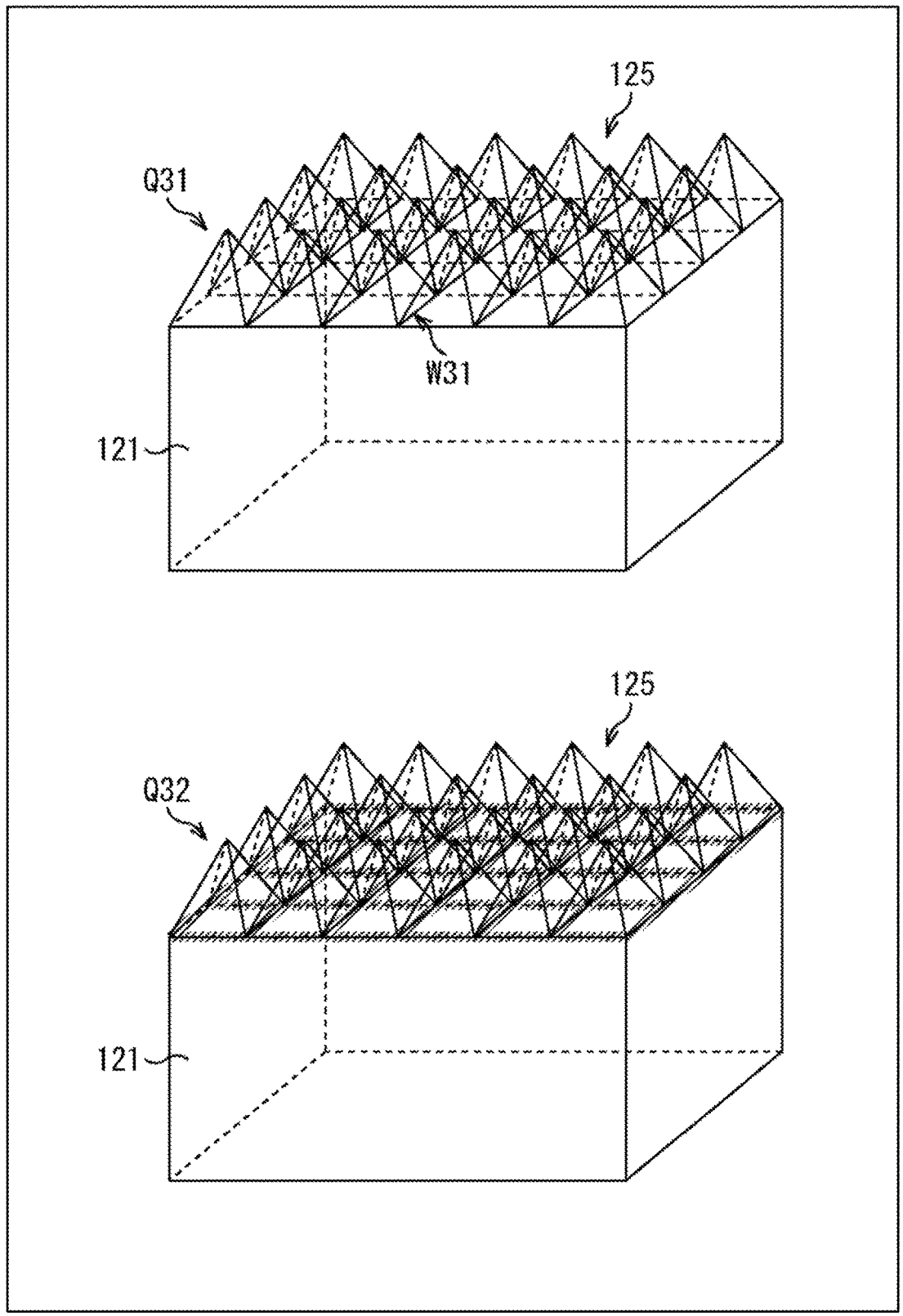
FIG. 8 is a diagram illustrating still another example of a configuration of a moth-eye section.

With reference to the first embodiment, the example in which the moth-eye section 125 has an inverted pyramid structure including quadrangular pyramid regions having the apexes on the side of the photodiode 124; it is also practicable for the moth-eye section 125 to have a normal pyramid structure as illustrated in FIG. 8, for example. It should be noted that with reference to FIG. 8, the same reference signs are assigned to the portions corresponding to those illustrated in FIG. 4, the description thereof being appropriately skipped.

In the example illustrated in FIG. 8, the upper side of the semiconductor substrate 121 in the drawing is the light incident side, namely, the side of the on-chip lens 132.

For example, as indicated by arrow Q31, the moth-eye section 125 is formed on the surface of the light incident side in the semiconductor substrate 121. Further, the moth-eye section 125 has an inverted pyramid structure in which plural quadrangular pyramid regions having the apexes on the side of the on-chip lens 132 that is the light incident side are arranged regularly, namely, in lattice.

Also in this example, each of the plural quadrangular regions is approximately the same in shape and approximately the same in size with each other, the bottom surface of each quadrangular pyramid being square in shape. Further, the semiconductor substrate 121 is engraved to form these quadrangular pyramid regions such that each quadrangular pyramid region protrudes toward the side opposite to the side of the photodiode 124.

Especially, in the moth-eye section 125, the bottom portion on the side of each quadrangular pyramid photodiode 124, the portion indicated by arrow W31, for example, is the recessed portion described above. Then, as with the example illustrated in FIG. 5, this recessed portion has a round shape having a curvature at the portion protruding toward the side of the photodiode 124 when viewing the cross section approximately parallel to the direction toward the photodiode 124 from the light incident side of the semiconductor substrate 121.

Therefore, as indicated by arrow Q32, for example, the portion including the bottom side of each quadrangular pyramid protruding upward in the drawing in the moth-eye section 125, namely, the hatched portion, is formed to have a curvature. As with the example illustrated in FIG. 5, this setup allows the prevention of the uneven mold or peeling of the insulation film 128 or the color filter 131 from on the semiconductor substrate 121.

Fifth Embodiment

<Still Another Exemplary Configuration of Moth-Eye Section>

Figure 9:
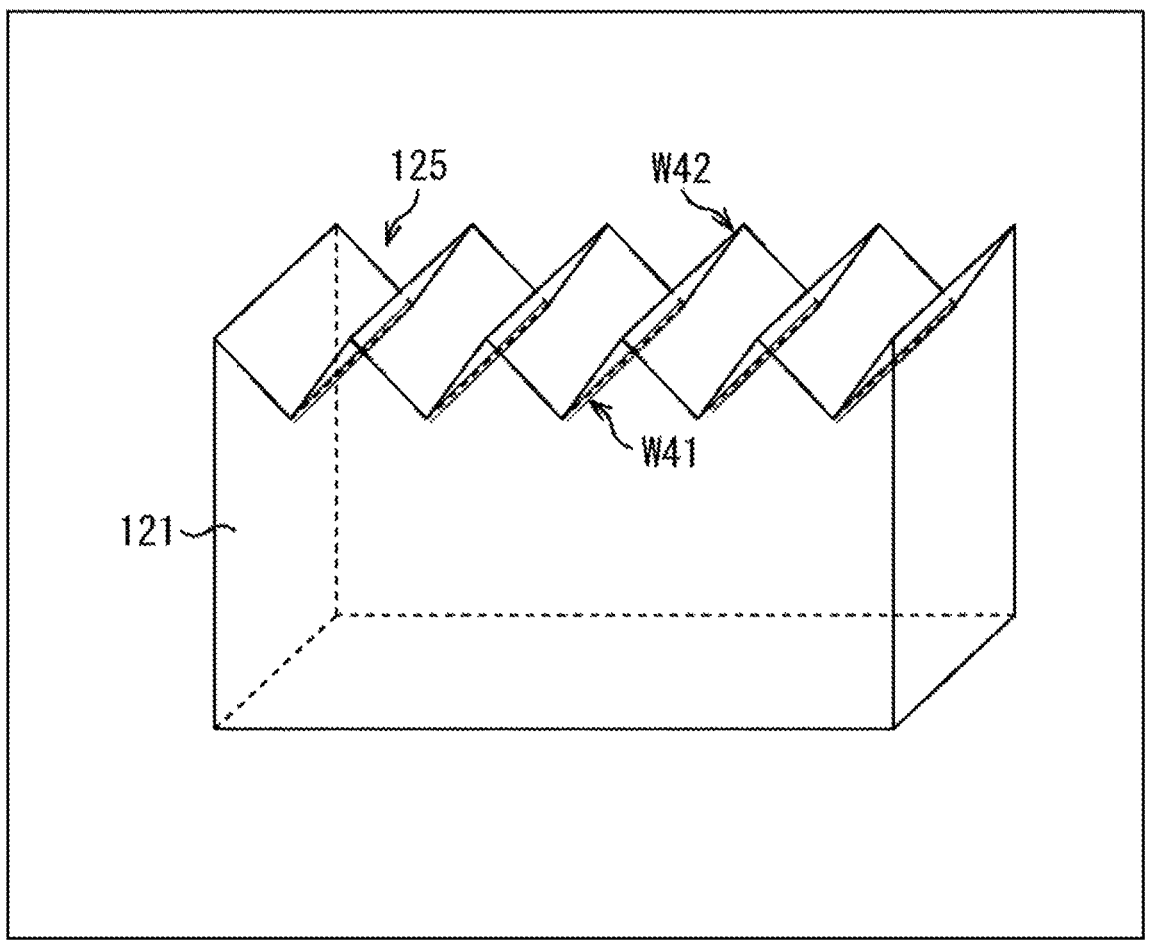
FIG. 9 is a diagram illustrating yet another example of a configuration of a moth-eye section.

Further, as illustrated in FIG. 9, for example, the bottom surface of the microscopic recessed and projected portions constituting the moth-eye section 125 may be made rectangular. It should be noted that with reference to FIG. 9, the same reference signs are assigned to the portions corresponding to those illustrated in FIG. 4, the description thereof being appropriately skipped.

In this example, the upper side in the drawing of the semiconductor substrate 121 is the light incident side, namely, the side of the on-chip lens 132.

The moth-eye section 125 is formed on the surface of the light incident side in the semiconductor substrate 121 and this moth-eye section 125 has a recessed portion which is formed on the side of the photodiode 124 and is linear in shape long along the direction approximately perpendicular to the optical axis of the on-chip lens 132.

To be more specific, the moth-eye section 125 is formed with a recessed portion having a curvature protruding toward the photodiode 124 when viewing the cross section approximately parallel to the direction toward the photodiode 124 from the light incident side in the semiconductor substrate 121. This recessed portion has a linear shape long along the direction approximately perpendicular to the cross section approximately parallel to the direction toward the photodiode 124 from the light incident side in the semiconductor substrate 121.

Therefore, in this example, the moth-eye section 125 has a shape in which, with one rectangular surface of the triangular prism directed toward the photodiode 124, plural triangular prisms having approximately the same shape and approximately the same size are arranged in one direction. That is, in the moth-eye section 125, plural recessed portions are arranged in the direction approximately perpendicular to the length direction of the recessed portion linear in shape on the plane approximately perpendicular toward the photodiode 124 from the light incident side.

Hence, the moth-eye section 125 has a saw-tooth shape when viewing the cross section approximately parallel to the direction toward the photodiode 124 from the light incident side in the moth-eye section 125, to be more precise, the cross section approximately perpendicular to the length direction of the recessed portion.

In this example, the portion indicated by arrow W41 is the recessed portion of the moth-eye section 125, for example, each recessed portion being indicated by hatching. Also, the portion indicated by arrow W42 is the projected portion of the moth-eye section 125, for example.

Especially, with the moth-eye section 125, the recessed portion has a curvature and is roundly shaped. Therefore, in this example too, the uneven mold or peeling of the insulation film 128 or the color filter 131 formed on the semiconductor substrate 121 can be prevented.

Sixth Embodiment

<Yet Another Exemplary Configuration of Moth-Eye Section>

Figure 10:
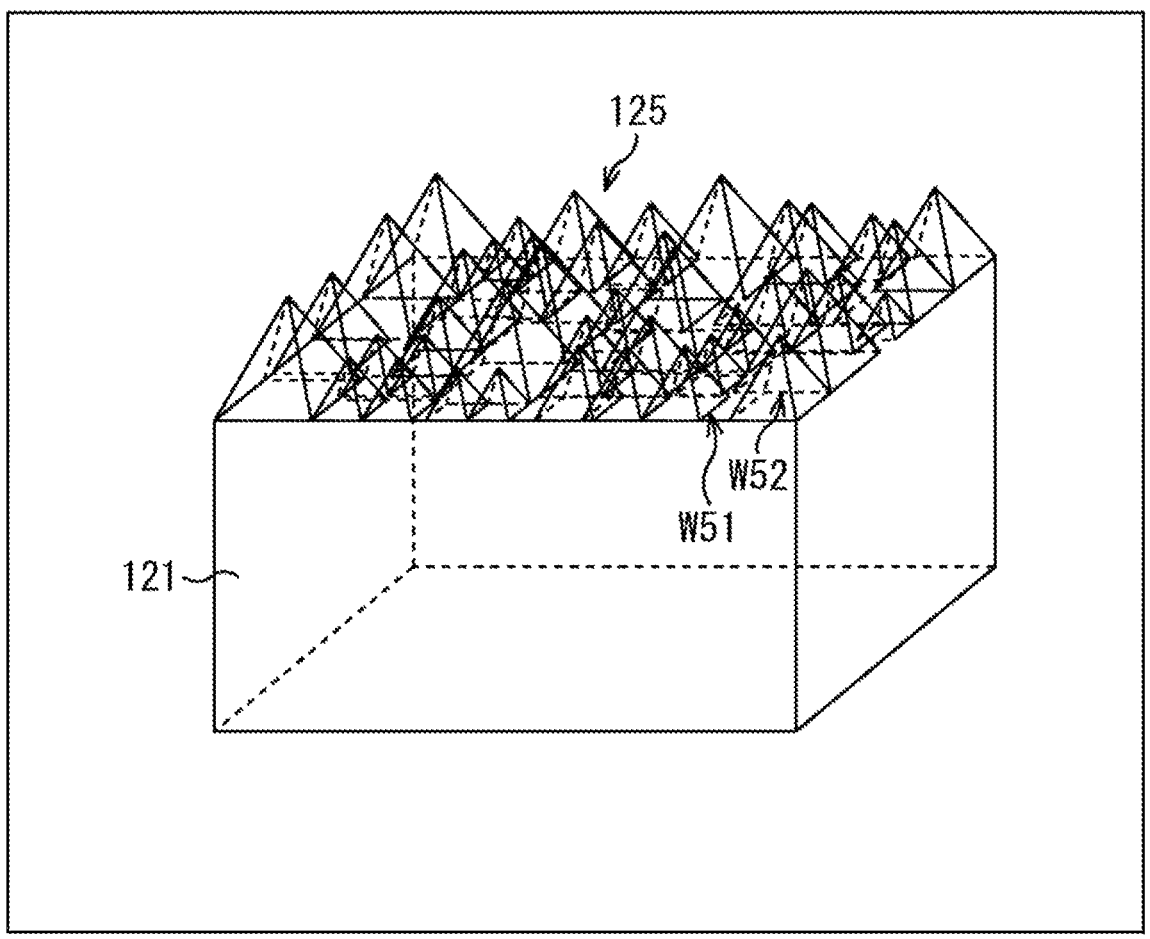
FIG. 10 is a diagram illustrating another example of a configuration of a moth-eye section.

With reference to FIG. 8, the example was described in which the moth-eye section 125 has a normal pyramid structure in which quadrangular pyramids approximately the same in shape and approximately the same in size are regularly arranged; however, it is also practicable that each quadrangular pyramid is different in size from each other or arranged irregularly as illustrated in FIG. 10, for example. It should be noted that with reference to FIG. 10, the same reference signs are assigned to the portions corresponding to those illustrated in FIG. 4, the description thereof being appropriately skipped.

In the example illustrated in FIG. 10, the upper side in the drawing of the semiconductor substrate 121 is the light incident side, namely, the side of the on-chip lens 132.

The moth-eye section 125 is formed on the surface of the light incident side in the semiconductor substrate 121 and this moth-eye section 125 has a normal pyramid structure in which quadrangular pyramid regions having apexes toward the upward side that is the side of the light incident side, namely, the side of the on-chip lens 132 are irregularly arranged. In addition, the size of each of the plural quadrangular pyramid regions is not equal to each other. That is, the size and arrangement of the quadrangular pyramids are random.

Especially, in the moth-eye section 125, the bottom side portions on the side of the photodiode 124 of each quadrangular pyramid region, the portions indicated by arrow W51 and arrow W52, for example, are recessed portions which have a curvature and are roundly shaped. This setup allows the prevention of the uneven mold or peeling of the insulation film 128 or the color filter 131 formed on the semiconductor substrate 121.

In the above, the example in which, in a case where the moth-eye section 125 has a normal pyramid structure, the size and arrangement of each quadrangular pyramid region that is a recessed and projected portion of the moth-eye section 125 is random has been described; however, the shape of the conical region that is each recessed and projected portion may also be random.

Likewise, the size, shape, and arrangement of each quadrangular pyramid region may also be random in the inverted pyramid structure illustrated in FIG. 5, for example. That is, the moth-eye section 125 in which plural pyramid regions including shapes and sizes different from each other are irregularly arranged may be formed on the semiconductor substrate 121.

Seventh Embodiment

<Still Another Exemplary Configuration of Pixel Array Section>

Figure 11:
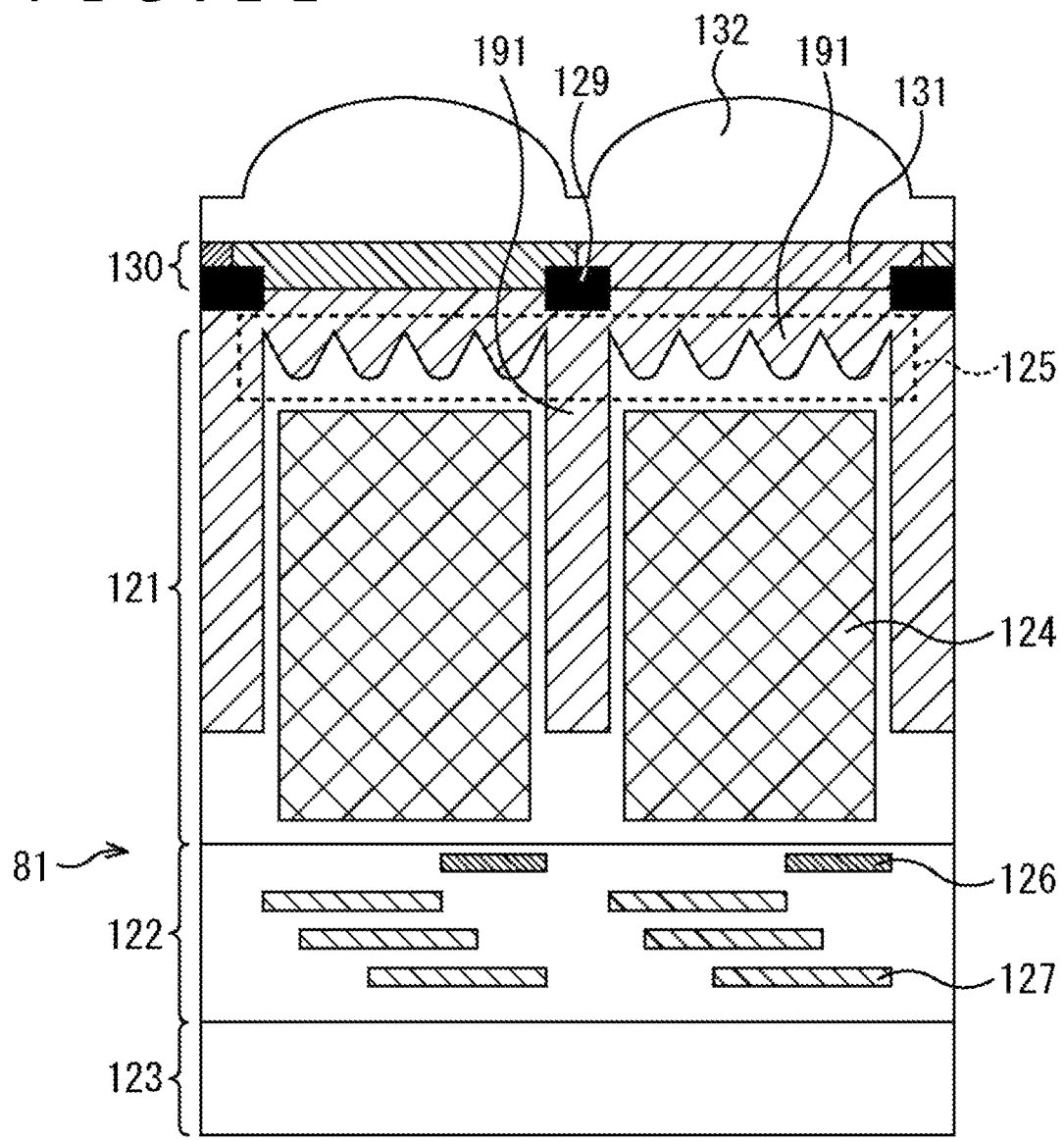
FIG. 11 is a diagram illustrating still another example of a configuration of a pixel array section.

In the example illustrated in FIG. 4, the insulation film 128 is formed only between the surface of the moth-eye section 125 and the color filter 131; however, as illustrated in FIG. 11, the insulation film may be formed also between pixels, namely, between the adjacent photodiodes 124. It should be noted that with reference to FIG. 11, the same reference signs are assigned to the portions corresponding to those illustrated in FIG. 4, the description thereof being appropriately skipped.

In the example illustrated in FIG. 11, an insulation film 191 is formed on the portion between the upper surface in the drawing of the moth-eye section 125 and the color filter 131 and the portion between adjacent photodiodes 124, namely the boundary portion between pixels. For example, the insulation film 191 is constituted of the similar material to the insulation film 128 illustrated in FIG. 4. Further, to be more precise, the portion between the insulation film 191 and each color filter 131 is formed with a planarization film not illustrated.

As described above, forming the insulation film 191 also between pixels allows the insulation film 191 in this portion between pixels to function as an inter-pixel separation section for electrically separating pixels (photodiodes 124) from each other, thereby reducing the noise in the photodiodes 124.

Eighth Embodiment

<Yet Another Exemplary Configuration of Pixel Array Section>

Figure 12:
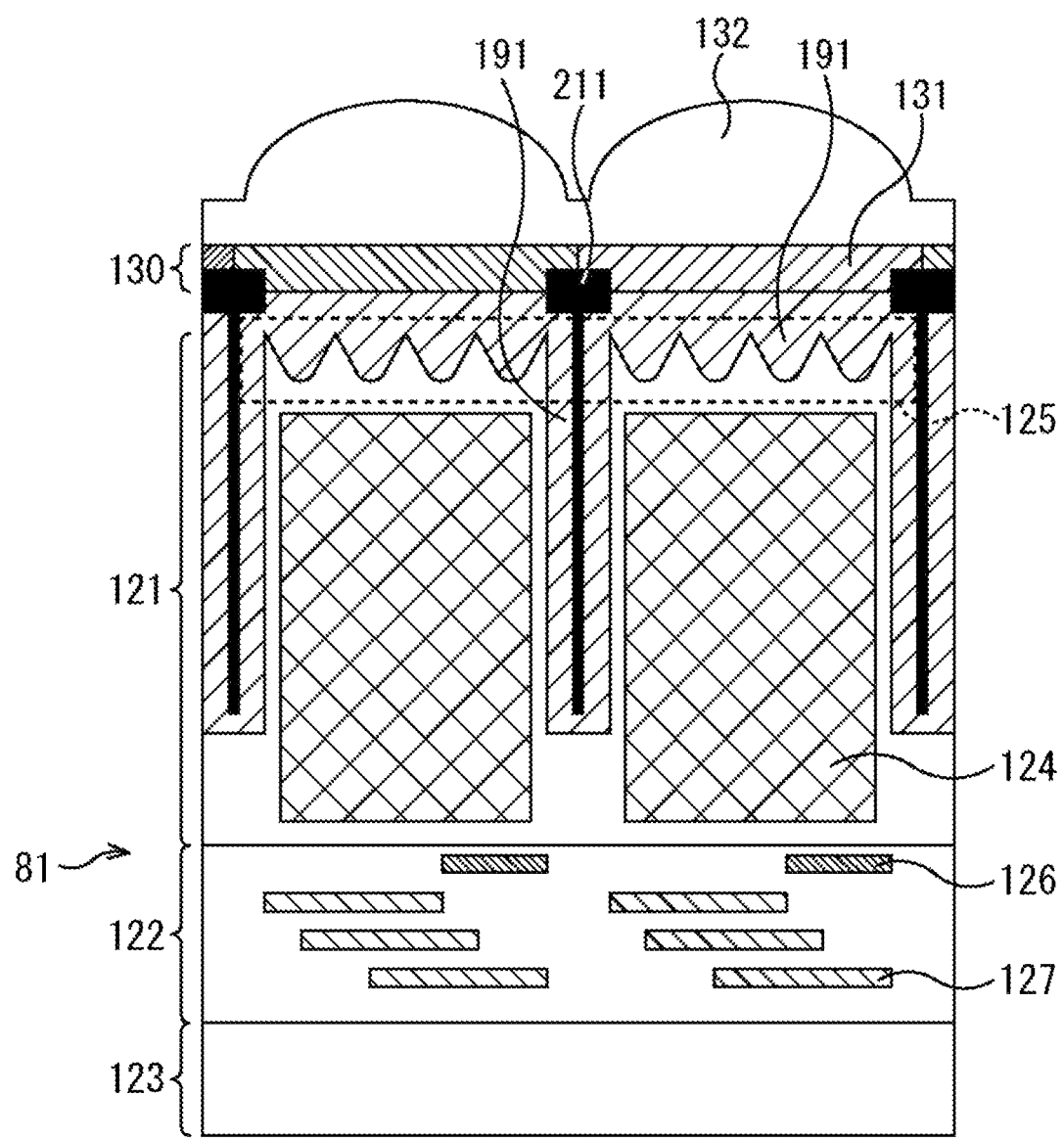
FIG. 12 is a diagram illustrating yet another example of a configuration of a pixel array section.

Further, in a case where the insulation film 191 is formed also on the portion between pixels as illustrated in FIG. 11, an inter-pixel light blocking film may also be formed on the portion between pixels in the insulation film 191, namely, the boundary portion between pixels as illustrated in FIG. 12. It should be noted that with reference to FIG. 12, the same reference signs are assigned to the portions corresponding to those illustrated in FIG. 11, the description thereof being appropriately skipped.

In the example illustrated in FIG. 12, not only the portion in the color filter 131 between pixels but also the portion between the adjacent photodiodes 124 inside the insulation film 191 is formed with an inter-pixel light blocking film 211. That is, the portion of the insulation film 191 is engraved to be formed with the inter-pixel light blocking film 211. This setup enhances the light blocking performance between pixels further than the example illustrated in FIG. 11.

Here, the inter-pixel light blocking film 211 is constituted of tungsten (W), aluminum (Al), or copper (Cu), for example, as with the inter-pixel light blocking film 129 illustrated in FIG. 11. It should be noted that the material of the inter-pixel light blocking film 211 may be any material that can block the light entered from the outside through the on-chip lens 132.

Ninth Embodiment

<Different Exemplary Configuration of Pixel Array Section>

Figure 13:
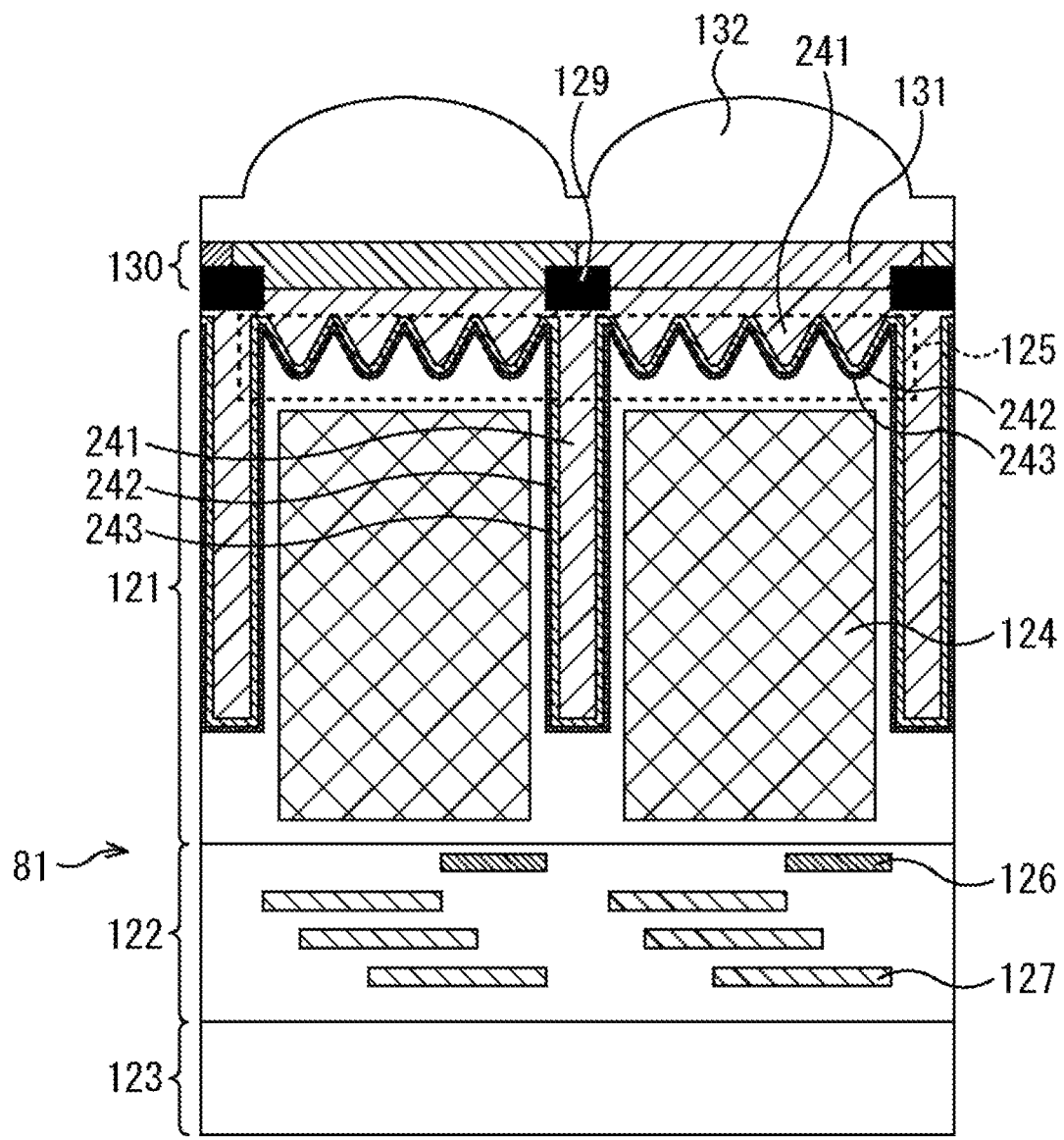
FIG. 13 is a diagram illustrating another example of a configuration of a pixel array section.

Further, as illustrated in FIG. 13, a planarization film may be formed instead of the insulation film 191 illustrated in FIG. 11 and a reflection blocking film and a transparent insulation film may be formed between that planarization film and the surface of the semiconductor substrate 121. It should be noted that with reference to FIG. 13, the same reference signs are assigned to the portions corresponding to those illustrated in FIG. 11, the description thereof being appropriately skipped.

In the example illustrated in FIG. 13, the portion between the upper side in the drawing of the moth-eye section 125 and the color filter 131 and the portion between the adjacent photodiodes 124, namely, the boundary portion between pixels, are formed with a planarization film 241. In this case, the portion between pixels of the planarization film 241 also functions as an inter-pixel separation section as with the case of the insulation film 191.

Further, the surface of the side of the semiconductor substrate 121 in this planarization film 241 is formed with a transparent insulation film 242 and the surface of the side of the semiconductor substrate 121 of this transparent insulation film 242 is formed with a reflection blocking film 243.

Therefore, these transparent insulation film 242 and reflection blocking film 243 are formed on the surface portion of the side of the on-chip lens 132 of the moth-eye section 125 and the side surface portion adjacent to the portion providing the inter-pixel separation section of the planarization film 241 in the semiconductor substrate 121. This setup further enhances the light reflection blocking effects.

It should be noted that the planarization film 241 is formed with an insulation film constituted of an organic material such as resin or an insulation film constituted of silicon oxide ($SiO_2$). Further, the transparent insulation film 242 and the reflection blocking film 243 are constituted of the similar materials to those of the transparent insulation film 162 and the reflection blocking film 161 described with reference to FIG. 7, for example. Still further, in the configuration illustrated in FIG. 13, an insulation film may be arranged between the surface of the moth-eye section 125 and the reflection blocking film 243.

Tenth Embodiment

<Still Different Exemplary Configuration of Pixel Array Section>

Figure 14:
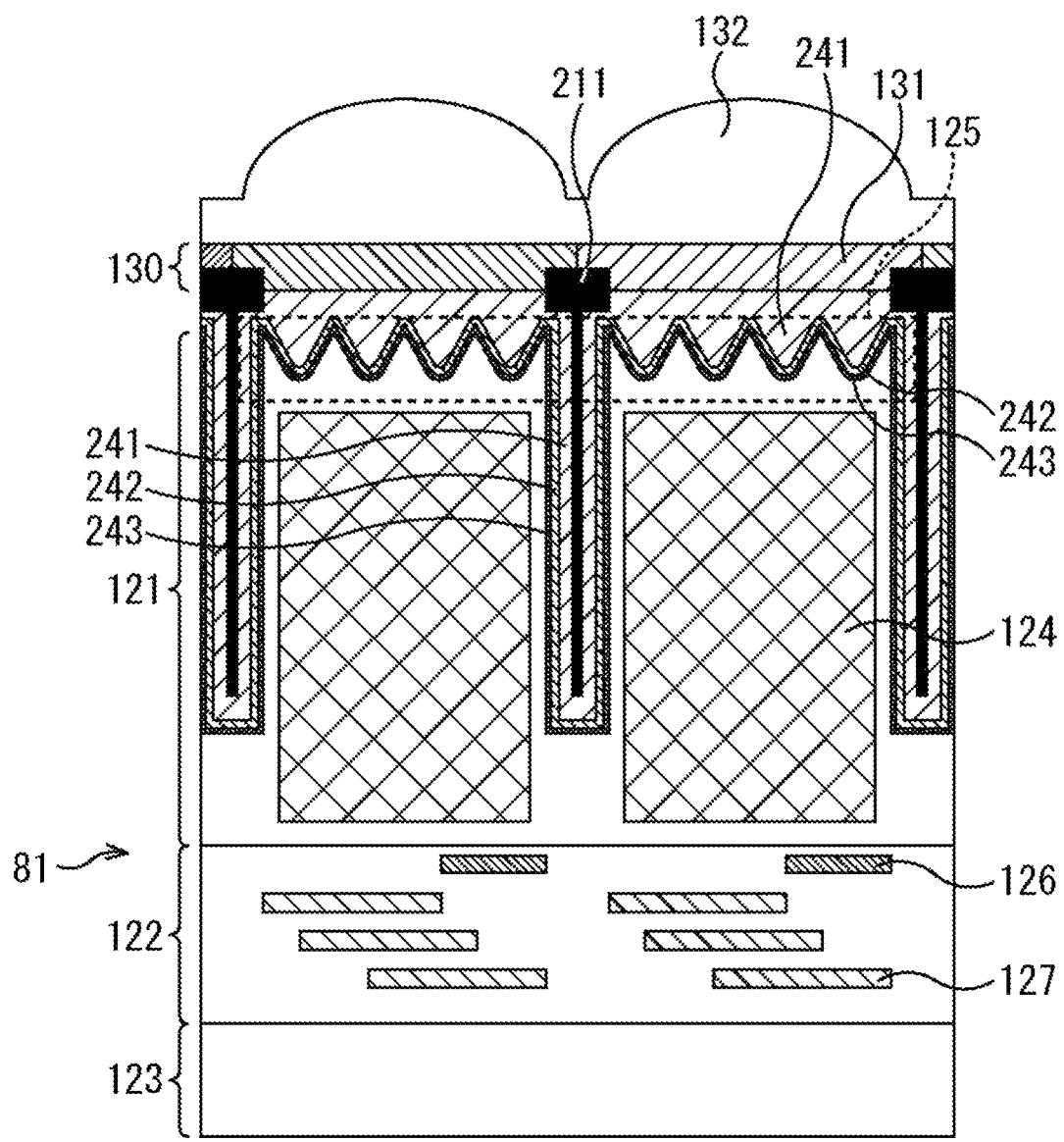
FIG. 14 is a diagram illustrating another example of a configuration of a pixel array section.

Further, as illustrated in FIG. 14, for example, in the configuration of the pixel array section 81 illustrated in FIG. 13, the inter-pixel light blocking film 211 illustrated in FIG. 12 may be formed instead of the inter-pixel light blocking film 129. It should be noted that with reference to FIG. 14, the same reference signs are assigned to the portions corresponding to those illustrated in FIG. 12 or FIG. 13, the description thereof being appropriately skipped.

As with the case illustrated in FIG. 12, in the example illustrated in FIG. 14, not only the portion of the color filter 131 between pixels but also the portion between the adjacent photodiodes 124 inside the planarization film 241 is also formed with the inter-pixel light blocking film 211.

Therefore, in this example, the reflection blocking film 243 and the inter-pixel light blocking film 211 can further enhance the light blocking performance between pixels.

It should be noted that, in the embodiments described above, the cases in which the present technology is applied to CMOS image sensors and so on in which pixels for detecting signal charges corresponding to the light quantity of visible light as physical quantity are arranged in matrix have been described. However, the present technology is not limited to the application to CMOS image sensors; namely, the present technology is also applicable to entire solid-state image pickup devices.

<Usage Examples of Solid-State Image Pickup Device>

Figure 15:
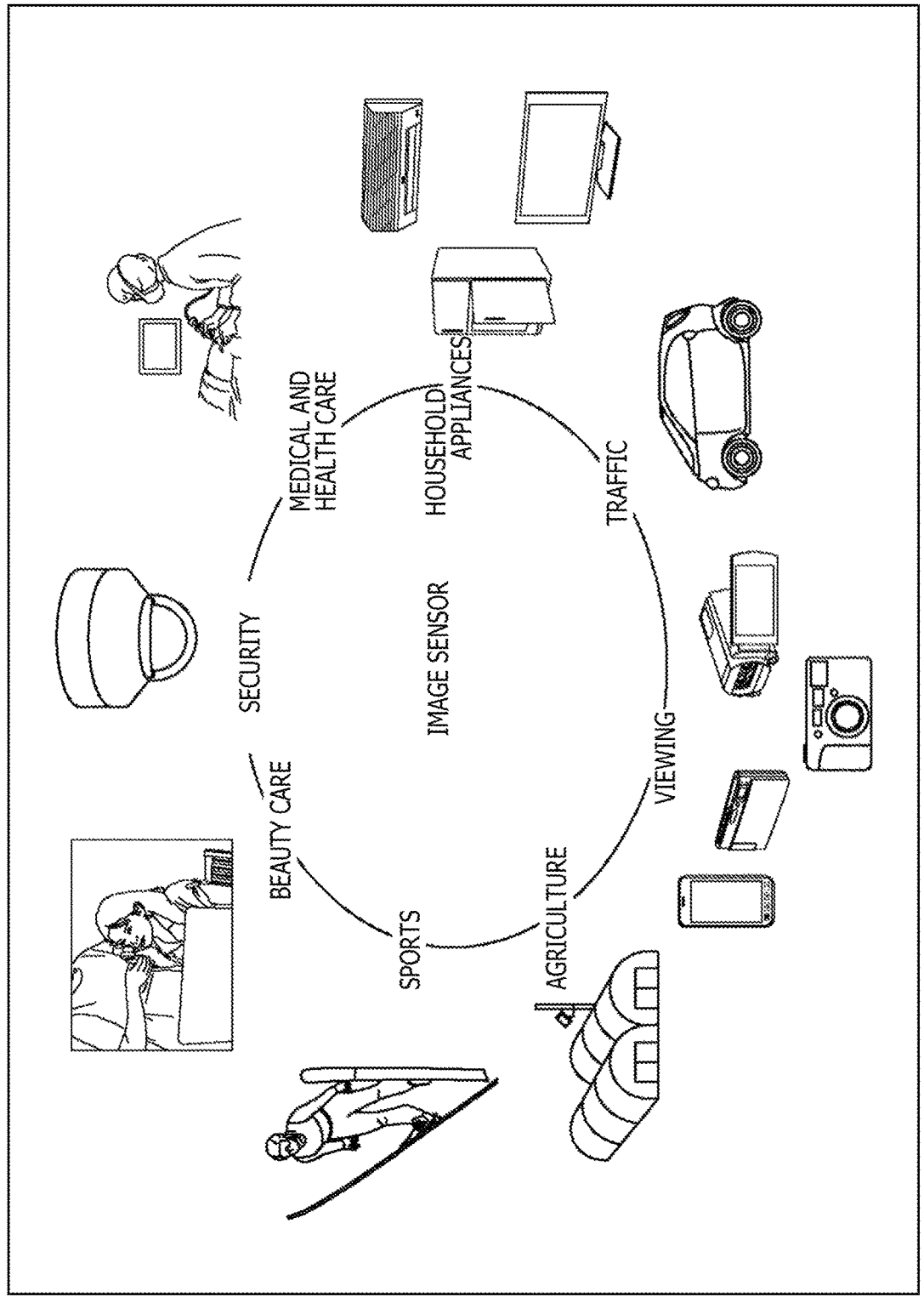
FIG. 15 is a diagram illustrating an example of use in which the solid-state image pickup device is used.

FIG. 15 is a diagram illustrating an example of use in which the solid-state image pickup device (image sensors) described above is used.

The solid-state image pickup device described above is usable in various cases for sensing visible light, infrared light, ultraviolet light, X ray, and so on as follows, for example.

Apparatuses for taking images for viewing, such as digital cameras, portable devices having camera functions, and so on;

Apparatuses for use in traffic, such as in-car sensors for taking images of the front and rear directions, around and inside automobiles, monitor cameras for monitoring running automobiles and roads, and distance sensors for measuring the distance between automobiles and so on, for the purpose of safety driving such as automatic stop and the like and the recognition of driver's states and the like;

Apparatuses for use in household appliances such as TVs, refrigerators, air conditioners, and so on so as to take images of user gestures and execute device control by following the taken user gestures;

Apparatuses for use in medical and health care, such as endoscopes, apparatuses for taking images of blood vessels by photo-detecting infrared light, and so on;

Apparatuses for use in security, such as monitor cameras for use in crime prevention, cameras for use in personal authentication, and so on;

Apparatuses for use in beauty care, such as skin analyzers for taking images of skin, microscopes for taking images of scalps, and so on;

Apparatuses for use in sports, such as action cameras and wearable cameras, and so on for sport uses; and Apparatuses for use in agriculture, such as cameras for monitoring farms and crop conditions.

Further, while the embodiments of the present technology have been described using specific terms, such description is for illustrative purpose only, and it is to be understood by those skilled in the art that changes and variations may be made without departing from the gist of the present technology.

Further, the present technology can take the following configuration.

(1)

An image pickup device including:

a photoelectric conversion section that is arranged on a semiconductor substrate and configured to photoelectrically convert an incident light;

a moth-eye section that includes recesses and projections formed on a surface on a light incident side in the semiconductor substrate and has, when a cross section approximately parallel to a direction toward the photoelectric conversion section from the light incident side is viewed, a recessed portion protruding toward the side of the photoelectric conversion section, the recessed portion having a curvature or a polygonal shape; and a region that is arranged adjacent to and opposite to the photoelectric conversion section of the moth-eye section and has a refractive index different from a refractive index of the semiconductor substrate.

(2)

The image pickup device according to (1) above, in which a projected portion protruding opposite to the photoelectric conversion section in the moth-eye section has a curvature or a polygonal shape.

(3)

The image pickup device according to (2) above, in which the curvature of the recessed portion is larger than the curvature of the projected portion.

(4)

The image pickup device according to (2) above, in which the curvature of the recessed portion is approximately equal to the curvature of the projected portion.

(5)

The image pickup device according to any one of (1) through (4) above, in which the refractive index of the semiconductor substrate is larger than the refractive index of the region.

(6)

The image pickup device according to any one of (1) through (5) above, in which the moth-eye section is formed with a plurality of conical-shaped regions protruding toward the side of the photoelectric conversion section.

(7)

The image pickup device according to any one of (1) through (5) above, in which the moth-eye section is formed with a plurality of conical-shaped regions protruding opposite to the photoelectric conversion section.

(8)

The image pickup device according to (6) or (7) above, in which the conical-shaped regions are arranged in lattice.

(9)

The image pickup device according to (6) or (7) above, in which the plurality of conical-shaped regions including sizes or shapes that are different from each other are irregularly arranged.

(10)

The image pickup device according to any one of (1) through (5) above, in which the moth-eye section is formed with the plurality of the recessed portions that are linear in shape long along the direction approximately perpendicular to the cross section and arranged side by side.

(11)

The image pickup device according to any one of (1) through (10) above, in which, between the photoelectric conversion sections mutually adjacent to each other in the semiconductor substrate, an inter-pixel separation section configured to electrically separate the photoelectric conversion sections from each other is arranged.

(12)

The image pickup device according to (11) above, in which an inter-pixel light blocking film for blocking the light is formed inside the inter-pixel separation section.

(13)

An electronic apparatus including:

a photoelectric conversion section that is arranged on a semiconductor substrate and configured to photoelectrically convert an incident light;

a moth-eye section that includes recesses and projections formed on a surface on a light incident side in the semiconductor substrate and has, when a cross section approximately parallel to a direction toward the photoelectric conversion section from the light incident side is viewed, a recessed portion protruding toward the side of the photoelectric conversion section, the recessed portion having a curvature or a polygonal shape; and a region that is arranged adjacent to and opposite to the photoelectric conversion section of the moth-eye section and has a refractive index different from a refractive index of the semiconductor substrate.

REFERENCE SIGNS LIST

41 . . . Image pickup apparatus, 52 . . . Solid-state image pickup device, 81 . . . Pixel array section, 121 . . . Semiconductor substrate, 124 . . . Photodiode, 125 . . . Moth-eye section, 129 . . . Inter-pixel light blocking film, 131 . . . Color filter, 132 . . . On-chip lens, 161 . . . Reflection blocking film, 162 . . . Transparent insulation film, 191 . . . Insulation film, 211 . . . Inter-pixel light blocking film, 242 . . . Transparent insulation film, 243 . . . Reflection blocking film

What is claimed is:

1. An image pickup device comprising:
    a first photoelectric conversion section disposed in a semiconductor substrate and configured to photoelectrically convert incident light;
    a moth-eye section formed in a surface of a light incident side of the semiconductor substrate such that, in a cross sectional view, the moth-eye section includes first recessed portions arranged over the first photoelectric conversion section and protruding toward the first photoelectric conversion section, the first recessed portions having a curvature or a polygonal shape;
    a second photoelectric conversion section adjacent to the first photoelectric conversion section; and
    at least one layer on a light incident side of the moth-eye section and having a refractive index different from a refractive index of the semiconductor substrate,
    wherein, in the cross sectional view, the moth-eye section includes second recessed portions arranged over the second photoelectric conversion section, and
    wherein a number of the first recessed portions is equal to a number of the second recessed portions.

2. The image pickup device according to claim 1, wherein projected portions in the moth-eye section protruding away from the first photoelectric conversion section and the second photoelectric conversion section have a curvature or a polygonal shape.

3. The image pickup device according to claim 2, wherein the projected portions have the curvature, and wherein the curvature of at least one of the first or second recessed portions is larger than the curvature of at least one of the projected portions.

4. The image pickup device according to claim 2, wherein the curvature of the at least one of the first or second recessed portions is approximately equal to the curvature of the at least one of the projected portions.

5. The image pickup device according to claim 1, wherein the refractive index of the semiconductor substrate is larger than the refractive index of the at least one layer.

6. The image pickup device according to claim 1, wherein the first and second recessed portions are conical-shaped.

7. The image pickup device according to claim 1, wherein the projected portions are conical-shaped.

8. The image pickup device according to claim 6, wherein the first and second recessed portions are arranged in a lattice structure.

9. The image pickup device according to claim 6, wherein the the first and second recessed portions have sizes or shapes that are different from each other and are irregularly arranged.

10. The image pickup device according to claim 1, wherein the first and second recessed portions are arranged linearly.

11. The image pickup device according to claim 1, further comprising: an inter-pixel separation section configured to electrically separate the first and second photoelectric conversion sections from each other.

12. The image pickup device according to claim 11, further comprising:
an inter-pixel light blocking film is formed inside the inter-pixel separation section.

13. An electronic apparatus comprising:
a first photoelectric conversion section disposed in a semiconductor substrate and configured to photoelectrically convert incident light;
a moth-eye section formed in a surface of a light incident side of the semiconductor substrate such that, in a cross sectional view, the moth-eye section includes first recessed portions arranged over the first photoelectric conversion section and protruding toward the first photoelectric conversion section, the first recessed portions having a curvature or a polygonal shape;
a second photoelectric conversion section adjacent to the first photoelectric conversion section; and
at least one layer on a light incident side of the moth-eye section and having a refractive index different from a refractive index of the semiconductor substrate,
wherein, in the cross sectional view, the moth-eye section includes second recessed portions arranged over the second photoelectric conversion section, and
wherein a number of the first recessed portions is equal to a number of the second recessed portions.

* * * * *